US008797798B2

(12) United States Patent
Conley et al.

(10) Patent No.: US 8,797,798 B2
(45) Date of Patent: Aug. 5, 2014

(54) FLASH EEPROM SYSTEM WITH SIMULTANEOUS MULTIPLE DATA SECTOR PROGRAMMING AND STORAGE OF PHYSICAL BLOCK CHARACTERISTICS IN OTHER DESIGNATED BLOCKS

(71) Applicant: SanDisk Corporation, Milpitas, CA (US)

(72) Inventors: Kevin M. Conley, San Jose, CA (US); John S. Mangan, Santa Cruz, CA (US); Jeffrey G. Craig, Fremont, CA (US)

(73) Assignee: Sandisk Corporation, Sunnyvale, CA (US)

( * ) Notice: Subject to any disclaimer, the term of this patent is extended or adjusted under 35 U.S.C. 154(b) by 0 days.

(21) Appl. No.: 13/957,234

(22) Filed: Aug. 1, 2013

(65) Prior Publication Data

US 2014/0133234 A1    May 15, 2014

Related U.S. Application Data

(60) Continuation of application No. 13/550,157, filed on Jul. 16, 2012, now Pat. No. 8,503,240, which is a
(Continued)

(51) Int. Cl.
*G11C 16/04*       (2006.01)
(52) U.S. Cl.
USPC ............. 365/185.11; 365/230.06; 365/230.03
(58) Field of Classification Search
CPC ....... G11C 11/5628; G11C 16/10; G11C 8/12
USPC ........................... 365/185.11, 230.06, 230.03
See application file for complete search history.

(56) References Cited

U.S. PATENT DOCUMENTS 3,500,142 A    3/1970  Kahng et al.
3,633,175 A    1/1972  Harper
(Continued)

FOREIGN PATENT DOCUMENTS

AU     0 557 723        1/1987
DE     3812147 A       11/1988
(Continued)

OTHER PUBLICATIONS

"A Reconfigurable Interconnect for In-Silicon Electronic Assembly", Yukin Hsia, et al., *IEEE*, (1982) pp. 7-16.
(Continued)

*Primary Examiner* — Tuan T Nguyen
(74) *Attorney, Agent, or Firm* — Davis Wright Tremaine LLP

(57) ABSTRACT

A non-volatile memory system is formed of floating gate memory cells arranged in blocks as the smallest unit of memory cells that are erasable together. One feature is the storage in separate blocks of the characteristics of a large number of blocks of cells in which user data is stored. These characteristics for user data blocks being accessed may, during operation of the memory system by its controller, be stored in a random access memory for ease of access and updating. A typical form of the memory system is as a card that is removably connectable with a host system but may alternatively be implemented in a memory embedded in a host system. The memory cells may be operated with multiple states in order to store more than one bit of data per cell.

13 Claims, 11 Drawing Sheets

Related U.S. Application Data continuation of application No. 13/027,055, filed on Feb. 14, 2011, now Pat. No. 8,223,547, which is a continuation of application No. 12/624,258, filed on Nov. 23, 2009, now Pat. No. 7,889,554, which is a division of application No. 12/403,014, filed on Mar. 12, 2009, now Pat. No. 7,646,667, which is a division of application No. 12/061,020, filed on Apr. 2, 2008, now Pat. No. 7,532,511, which is a continuation of application No. 11/679,012, filed on Feb. 26, 2007, now Pat. No. 7,362,613, which is a continuation of application No. 11/323,576, filed on Dec. 29, 2005, now Pat. No. 7,184,306, which is a continuation of application No. 10/841,406, filed on May 6, 2004, now Pat. No. 6,996,008, which is a continuation of application No. 10/422,216, filed on Apr. 23, 2003, now Pat. No. 6,760,255, which is a continuation of application No. 10/176,880, filed on Jun. 21, 2002, now Pat. No. 6,580,638, which is a continuation of application No. 09/505,555, filed on Feb. 17, 2000, now Pat. No. 6,426,893.

(56) References Cited

U.S. PATENT DOCUMENTS

| | | |
|---|---|---|
| 4,051,460 A | 9/1977 | Yamada et al. |
| 4,250,570 A | 2/1981 | Tsang et al. |
| 4,281,398 A | 7/1981 | McKenny et al. |
| 4,287,570 A | 9/1981 | Stark |
| 4,398,248 A | 8/1983 | Hsia et al. |
| 4,450,559 A | 5/1984 | Bond et al. |
| 4,498,146 A | 2/1985 | Martinez |
| 4,525,839 A | 6/1985 | Nozawa et al. |
| 4,616,311 A | 10/1986 | Sato |
| 4,654,847 A | 3/1987 | Dutton |
| 4,746,998 A | 5/1988 | Robinson et al. |
| 4,748,320 A | 5/1988 | Yorimoto et al. |
| 4,757,474 A | 7/1988 | Fukushi et al. |
| 4,774,700 A | 9/1988 | Satoh et al. |
| 4,780,855 A | 10/1988 | Iida et al. |
| 4,800,520 A | 1/1989 | Iijima |
| 4,829,169 A | 5/1989 | Watanabe |
| 4,896,262 A | 1/1990 | Wayama et al. |
| 4,914,529 A | 4/1990 | Bonke |
| 4,945,535 A | 7/1990 | Hosotani et al. |
| 5,095,344 A | 3/1992 | Harari |
| 5,163,021 A | 11/1992 | Mehrotra et al. |
| 5,172,338 A | 12/1992 | Mehrotra et al. |
| 5,200,959 A | 4/1993 | Gross et al. |
| 5,218,691 A | 6/1993 | Tuma et al. |
| 5,270,979 A | 12/1993 | Harari et al. |
| 5,303,198 A | 4/1994 | Adachi et al. |
| 5,315,541 A | 5/1994 | Harari et al. |
| 5,337,275 A | 8/1994 | Garner |
| 5,341,339 A | 8/1994 | Wells |
| 5,353,256 A | 10/1994 | Fandrich et al. |
| 5,357,475 A | 10/1994 | Hasbun et al. |
| 5,388,083 A | 2/1995 | Assar et al. |
| 5,404,485 A | 4/1995 | Ban |
| 5,418,752 A | 5/1995 | Harari et al. |
| 5,422,856 A | 6/1995 | Sasaki et al. |
| 5,428,621 A | 6/1995 | Mehrotra et al. |
| 5,430,859 A | 7/1995 | Norman et al. |
| 5,438,573 A | 8/1995 | Mangan et al. |
| 5,457,658 A | 10/1995 | Niijima et al. |
| 5,471,478 A | 11/1995 | Mangan et al. |
| 5,479,638 A | 12/1995 | Assar et al. |
| 5,485,595 A | 1/1996 | Assar et al. |
| 5,504,760 A | 4/1996 | Harari et al. |
| 5,524,230 A | 6/1996 | Sakaue et al. |
| 5,530,828 A | 6/1996 | Kaki et al. |
| 5,532,962 A | 7/1996 | Auclair et al. |
| 5,535,328 A | 7/1996 | Harari et al. |
| 5,544,119 A | 8/1996 | Wells et al. |
| 5,544,356 A | 8/1996 | Robinson et al. |
| 5,559,956 A | 9/1996 | Sukegawa |
| 5,566,314 A | 10/1996 | DeMarco et al. |
| 5,598,370 A | 1/1997 | Niijima et al. |
| 5,602,987 A | 2/1997 | Harari et al. |
| 5,603,001 A | 2/1997 | Sukegawa et al. |
| 5,615,190 A | 3/1997 | Best et al. |
| 5,633,824 A | 5/1997 | Onuki |
| 5,652,720 A | 7/1997 | Aulas et al. |
| 5,663,901 A | 9/1997 | Wallace et al. |
| 5,673,383 A | 9/1997 | Sukegawa |
| 5,677,872 A | 10/1997 | Samachisa et al. |
| 5,682,497 A | 10/1997 | Robinson |
| 5,712,179 A | 1/1998 | Yuan |
| 5,712,180 A | 1/1998 | Guterman et al. |
| 5,719,808 A | 2/1998 | Harari et al. |
| 5,737,742 A | 4/1998 | Achiwa et al. |
| 5,740,396 A | 4/1998 | Mason |
| 5,742,934 A | 4/1998 | Shinohara |
| 5,754,567 A | 5/1998 | Norman |
| 5,768,194 A * | 6/1998 | Matsubara et al. ...... 365/185.33 |
| 5,787,484 A | 7/1998 | Norman |
| 5,798,968 A | 8/1998 | Lee et al. |
| 5,835,413 A | 11/1998 | Hurter et al. |
| 5,835,935 A | 11/1998 | Estakhri et al. |
| 5,838,614 A | 11/1998 | Estakhri et al. |
| 5,862,080 A | 1/1999 | Harari et al. |
| 5,864,661 A | 1/1999 | Ohara |
| 5,867,417 A | 2/1999 | Wallace et al. |
| 5,877,523 A | 3/1999 | Liang et al. |
| 5,890,192 A | 3/1999 | Lee et al. |
| 5,907,856 A | 5/1999 | Estakhri et al. |
| 5,909,449 A | 6/1999 | So et al. |
| 5,924,113 A | 7/1999 | Estakhri et al. |
| 5,928,370 A | 7/1999 | Asnaashari |
| 5,930,167 A | 7/1999 | Lee et al. |
| 5,930,815 A | 7/1999 | Estakhri et al. |
| 5,937,425 A | 8/1999 | Ban |
| 5,946,714 A | 8/1999 | Miyauchi |
| 5,953,737 A | 9/1999 | Estakhri et al. |
| 5,963,970 A | 10/1999 | Davis |
| 5,987,563 A | 11/1999 | Itoh et al. |
| 5,999,446 A | 12/1999 | Harari et al. |
| 6,000,006 A | 12/1999 | Bruce et al. |
| 6,014,724 A | 1/2000 | Jenett |
| 6,014,755 A | 1/2000 | Wells et al. |
| 6,034,897 A | 3/2000 | Estakhri et al. |
| 6,040,997 A | 3/2000 | Estakhri |
| 6,041,001 A | 3/2000 | Estakhri |
| 6,047,352 A | 4/2000 | Lakhani et al. |
| 6,076,137 A | 6/2000 | Asnaashari |
| 6,081,447 A | 6/2000 | Lofgren et al. |
| 6,081,878 A | 6/2000 | Estakhri et al. |
| 6,115,785 A | 9/2000 | Estakhri et al. |
| 6,122,195 A | 9/2000 | Estakhri et al. |
| 6,125,435 A | 9/2000 | Estakhri et al. |
| 6,130,836 A | 10/2000 | Matsubara et al. |
| 6,130,837 A | 10/2000 | Yamagami et al. |
| 6,134,143 A | 10/2000 | Norman |
| 6,141,249 A | 10/2000 | Estakhri et al. |
| 6,145,051 A | 11/2000 | Estakhri et al. |
| 6,151,247 A | 11/2000 | Estakhri et al. |
| 6,151,248 A | 11/2000 | Harari et al. |
| 6,157,983 A | 12/2000 | Lee et al. |
| 6,172,906 B1 | 1/2001 | Estakhri et al. |
| 6,202,138 B1 | 3/2001 | Estakhri et al. |
| 6,222,762 B1 | 4/2001 | Guterman et al. |
| 6,223,308 B1 | 4/2001 | Estakhri et al. |
| 6,282,624 B1 | 8/2001 | Kimura et al. |
| 6,288,861 B1 | 9/2001 | Blaum et al. |
| 6,327,639 B1 | 12/2001 | Asnaashari |
| 6,345,001 B1 | 2/2002 | Mokhlesi |
| 6,370,628 B2 | 4/2002 | Beppu |
| 6,388,919 B2 | 5/2002 | Terasaki |
| 6,421,292 B1 | 7/2002 | Kitamoto et al. |
| 6,426,893 B1 | 7/2002 | Conley et al. |
| 6,542,956 B1 | 4/2003 | Lee et al. |
| 6,580,638 B2 | 6/2003 | Conley et al. |

(56) References Cited

U.S. PATENT DOCUMENTS

| | | | |
|---|---|---|---|
| 6,591,328 | B1 | 7/2003 | Iida et al. |
| 6,665,203 | B2 | 12/2003 | Fujisawa et al. |
| 6,684,289 | B1 | 1/2004 | Gonzalez et al. |
| 6,725,321 | B1 | 4/2004 | Sinclair et al. |
| 6,760,255 | B2 | 7/2004 | Conley et al. |
| 6,763,424 | B2 | 7/2004 | Conley |
| 6,763,480 | B2 | 7/2004 | Harari et al. |
| 6,829,673 | B2 | 12/2004 | Lee et al. |
| 6,845,438 | B1 | 1/2005 | Tanaka et al. |
| 6,947,332 | B2 | 9/2005 | Wallace et al. |
| 6,996,008 | B2 | 2/2006 | Conley et al. |
| 7,050,337 | B2 | 5/2006 | Iwase et al. |
| 7,184,306 | B2 | 2/2007 | Conley et al. |
| 7,254,668 | B1 | 8/2007 | Chang et al. |
| 7,362,613 | B2 | 4/2008 | Conley et al. |
| 7,433,993 | B2 | 10/2008 | Sinclair |
| 7,492,643 | B2 | 2/2009 | Takeuchi |
| 7,532,511 | B2 | 5/2009 | Conley et al. |
| 2001/0004326 | A1 | 6/2001 | Terasaki |
| 2001/0012222 | A1 | 8/2001 | Terasaki |
| 2002/0001215 | A1 | 1/2002 | Fujisawa et al. |
| 2005/0144357 | A1 | 6/2005 | Sinclair |
| 2005/0207220 | A1 | 9/2005 | Takeuchi |
| 2005/0281113 | A1 | 12/2005 | Yada et al. |
| 2007/0086260 | A1 | 4/2007 | Sinclair |
| 2009/0175077 | A1* | 7/2009 | Takase et al. ............ 365/185.03 |
| 2009/0175082 | A1 | 7/2009 | Conley et al. |
| 2009/0204747 | A1 | 8/2009 | Lavan et al. |
| 2010/0049910 | A1 | 2/2010 | Conley et al. |
| 2010/0067298 | A1 | 3/2010 | Conley et al. |
| 2010/0188883 | A1 | 7/2010 | Chen et al. |

FOREIGN PATENT DOCUMENTS

| | | |
|---|---|---|
| EP | 0220718 B1 | 5/1987 |
| EP | 0548564 A2 | 11/1992 |
| EP | 0686976 A2 | 12/1995 |
| JP | 59-45694 A | 3/1984 |
| JP | 59-45695 A | 3/1984 |
| JP | 60-076097 A | 4/1985 |
| JP | 62-283496 A | 12/1987 |
| JP | 62-283497 A | 12/1987 |
| JP | 64-70843 A | 3/1989 |
| WO | WO 97/43764 A1 | 11/1997 |
| WO | WO 99/44113 A2 | 9/1999 |
| WO | WO 00/30116 A1 | 5/2000 |
| WO | WO 00/49488 | 8/2000 |
| WO | WO 01/061703 A2 | 8/2001 |
| WO | WO02/19334 A2 | 3/2002 |

OTHER PUBLICATIONS

"Adaptive Wafer Scale Integration", Yukon Hsia, et al., Proceeding of the 11*th* Conference (1979 International), *Japanese Journal of Applied Physics*, vol. 19 (1980) Supplement 19-1, pp. 193-202.
Brewer et al., "Nonvolatile Memory Technologies with Emphasis on Flash," IEEE Press, ISBN 978-0471-77002-2, 2008, 5 pages.
Cappelletti et al., "Flash Memories," Chapter 1: Flash Memories: An Overview and Chapter 9: Flash Memories: Market, Marketing and Economic Challenges, Kluwer Academic Publishers, ISBN 0-7923-8487-3, 1999, 95 pages.
Chinese Patent Office, "Notification of the First Office Action", mailed in corresponding Chinese Application No. 01806804.9 on Oct. 15, 2004, 10 pages (including translation).
Chinese Patent Office, Notification of Second Office Action, mailed in corresponding Chinese Application No. 01806804.9 on Sep. 2, 2005, 10 pages (including translation).
Communication Relating to the Results of Partial International Search dated Jul. 5, 2001—2 pages.
Dipert et al., "Designing with Flash Memory," Chapters 1, 2, 5, 7-10, Annabooks, ISBN 0-929392-17-5, Oct. 1993, 432 pages.
Finch et al., "Headerless disk formatting: Making room for more data," Data Storage, Apr. 1997, pp. 51-54.

Forella, "Flash Memory Mass Storage Technology Tradeoffs," IEEE International Non Volatile Memory Technology Conference Proceedings, 1996, pp. 116-119.
International Search Report for corresponding PCT application No. PCT/US01/05052 dated Apr. 15, 2002.
Kahng et al., "A Floating Gate and Its Application to Memory Devices," The Bell System Technical Journal, vol. 46, Jul.-Aug. 1967, pp. 1288-1295.
Kawaguchi et al., "A Flash-Memory Based File System," Proceedings on USENIX 1995 Technical Conference Proceedings, New Orleans, Louisiana, Jan. 16-20, 1995, pp. 13-22.
Kjelso et al., "Memory Management in Flash-Memory Disks with Data Compression," Lecture Notes in Computer Science; vol. 986, Proceedings of the International Workshop on Memory Management, pp. 399-413, 1995, ISBN 3-540-60368-9, 17 pages.
"Memory Applications of the MNOS", Yukon Hsia, *1972 Wescon Technical Papers vol. 16*, (1972) pp. 1-5.
MMCA Technical Committe, The MiltiMedia Card, System Specification, Version 1.4, Feb. 1998, 106 pages.
Nozoe et al., "A 256-Mb multilevel flash memory with 2-Mb/s program rate for mass storage applications," IEEE Journal of Solid State Circuits, vol. 34, No. 11, Nov. 1999, 7 pages.
Pashley,"Nonvolatility: Semiconductor vs Magnetic," IEEE ISSCC Digest of Technical Papers, Feb. 18, 1988, pp. 214-215.
PCMCIA/JEIDA, PC Card Standard Specification, vol. 1: Overview and Glossary, vol. 7: Media Storage Formats Specification, Mar. 1997, 85 pages.
PCMCIA/JEIDA, PC Card Standard Specification Update, vol. 7: Media Storage Formats Specification, Apr. 1998, 38 pages.
Photo International, Digital: SanDisk Introduces 64, 80, 96 and 160 MB CompactFlash Memory, Feb. 1999, 1 page.
SanDisk Corporation, Preliminary MultiMediaCard Product Manual, Apr. 28, 1998, 96 pages.
SanDisk Corporation, Timeline of Innovation, printed from Internet on Mar. 8, 2006, 2 pages, http://sandisk.com/Corporate/Timeline/Years1996-1999.aspx.
SanDisk Corporation, SDP5A Product Mannual, 1994, 88 pages.
Sandisk Israel, MediaClip Memory Card MMC Controller Top Level Design, Version 0.1, Nov. 13, 1996, 74 pages.
United States International Trade Commission, In the Matter of Certain Flash Memory Controllers, Drivers, Memory Cards, and Media Payers and Products Containing same, Inv. No. 337-TA-619, Order No. 33: Order Construing the Terms of the Asserted Claims of the Patents at Issue, Jul. 15, 2008, pp. i-iii, 1-10 and 35-53.
Paul S. Min, Ph.D, "Rebuttal Report on Validity of U.S. Patent No. 6,426,893,", dated Jul. 24, 2008, 126 pages.
Dr. Richard Pashley, "Expert Report Regarding the Invalidity and Unenforceability of the 893 Patent," dated Aug. 8, 2008, 221 pages.
Exhibit No. 59 from Dr. Richard Pashley's Expert Report, "Scope and Content of the Prior Art," dated Aug. 8, 2008, 20 pages.
Exhibit No. 60 from Dr. Richard Pashley's Expert Report, "Additional Referene Citations Providing Motivation or Suggestions to Combine Prior Art," dated Aug. 8, 2008, 9 pages.
Exhibit No. 61 through No. 64 from Dr. Richard Pashley's Expert Report, Claim Chart 12-1, 13, 14 and 17, dated Aug. 8, 2008, total 243 pages.
Exhibit No. 65 through 67 from Dr. Richard Pashley's Expert Report, Claim Charts 25, 27 and 30, dated Aug. 8, 2008, total 377 pages.
Exhibit No. 68 from Dr. Richard Pashley's Expert Report, Claim Chart 36, dated Aug. 8, 2008, 223 pages.
Exhibits No. 69 through No. 72 and No. 75 through 84 from Dr. Richard Pashley's Expert Report, dated Aug. 8, 2008, Claim Charts, total 353 pages.
Exhibit No. 132 from Dr. Richard Pashley's Expert Report, SanDisk Wins Awards, printed from Internet an Jan. 6, 2005, 4 pages, http://www.livingroom.org.au/phitolog/news/sandisk_win_awards.php.
Exhibits No. 134 through 145 from Dr. Richard Pashley's Expert Report, Claim Charts 25 and 36, dated Aug. 8, 2008, total 270 pages.
Niijima; "Design of a solid-state file using flash EEPROM," IBM J. Res. Develop, vol. 39, No. 5, Sep. 1995, 15 pages (as markedup).
Dr. Guterman's Memorandum, "Higher Write Speed Alternatives—Revisited," dated May 20, 1996, 10 pages.

(56) References Cited

OTHER PUBLICATIONS

SanDisk Corporation, SDP-32 Mbit "Mizer" Low Cost HD, Logical Format 20-10-00050, Rev. 8, Dec. 5, 1997, 32 pages.
Heller Ehrman, Letter from A. Sharma to J. Yoon identifying Heller's Respondents' Prior Art, dated Mar. 10, 2008, 7 pages.
United States International Trade Commission, Investigation No. 337-TA-619, Notice of Prior Art of Respondents Apacer Technology, Inc. and Apacer Memory America, Inc., Silicon Motion Technology Corporation, Silicon Motion, Inc. (Taiwan), Silicon Motion, Inc. (California) and Silicon Motion International, Inc., Transcend Information, Inc. (Taiwan), Transcend Information, Inc. (California) and Transcend Information Maryland, Inc., dated Jul. 11, 2008, 17 pages.
United States International Trade Commission, Investigation No. 337-TA-619, Chipsbank Respondents' Notice of Prior Art, dated Jul. 11, 2008, 11 pages.
United States International Trade Commission, Investigation No. 337-TA-619, The Heller Respondents' Notice of Prior Art, dated Jul. 11, 2008, 23 pages.
United States International Trade Commission, Investigation No. 337-TA-619, Respondents Kingston Technology Co., Inc., Kingston Technology Corporation, Memosun, Inc., Payton Technology Corporation, and Phison Electronics Corporation's Notice of Prior Art, dated Jul. 11, 2008, 19 pages.
United States International Trade Commission, Investigation No. 337-TA-619, Respondents LG Electronics, Inc. and LG Electronics U.S.A., Inc'S Notice of Prior Art, Jul. 11, 2008, 16 pages.
Dr. Harari's Notes dated Feb. 24, 1992, 12 pages.
Deposition of Kevin M. Conley's dated Jul. 24, 2008, vol. I, 49 pages.
Deposition of Kevin M. Conley's dated Jul. 25, 2008, vol. II, 35 pages.
Deposition of Kevin M. Conley's dated Sep. 11, 2008, vol. III, 35 pages.
Exhibits No. 1 through No. 12, No. 15 through No. 22, No. 24 through No. 26, No. 28 through No. 32, to Deposition of Kevin M. Conley, dated Jul. 24-25, 2008, total 573 pages.
Exhibits No. 37 through No. 56, No. 58, No. 59, No. 61 through No. 72, to Deposition of Kevin M. Conley, dated Sep. 11, 2008, total 729 pages.
Deposition of John Mangan dated Jul. 10, 2008, vol. 1, 61 pages.
Deposition of John Mangan dated Jul. 11, 2008, vol. 2, 37 pages.
Exhibits No. 1 through No. 10 to the Deposition of John Mangan, Jul. 10-11, 2008, total 540 pages.
Exhibits No. 11 through No. 15, No. 17 through No. 25, No. 29, No. 31, No. 32 to the Deposition John Mangan, Jul. 10-11, 2008, total 504 pages.
USPTO, "Notice of Allowance and Fee(s) Due," mailed in related U.S. Appl. No. 11/679,012 on Dec. 3, 2007, 11 pages.
USPTO, "Notice of Allowance and Fee(s) Due," mailed in related U.S. Appl. No. 12/402,955 on Aug. 11, 2009, 30 pages.
USPTO, "Notice of Allowance and Fee(s) Due," mailed in related U.S. Appl. No. 12/611,280 on Oct. 6, 2010, 26 pages.

\* cited by examiner

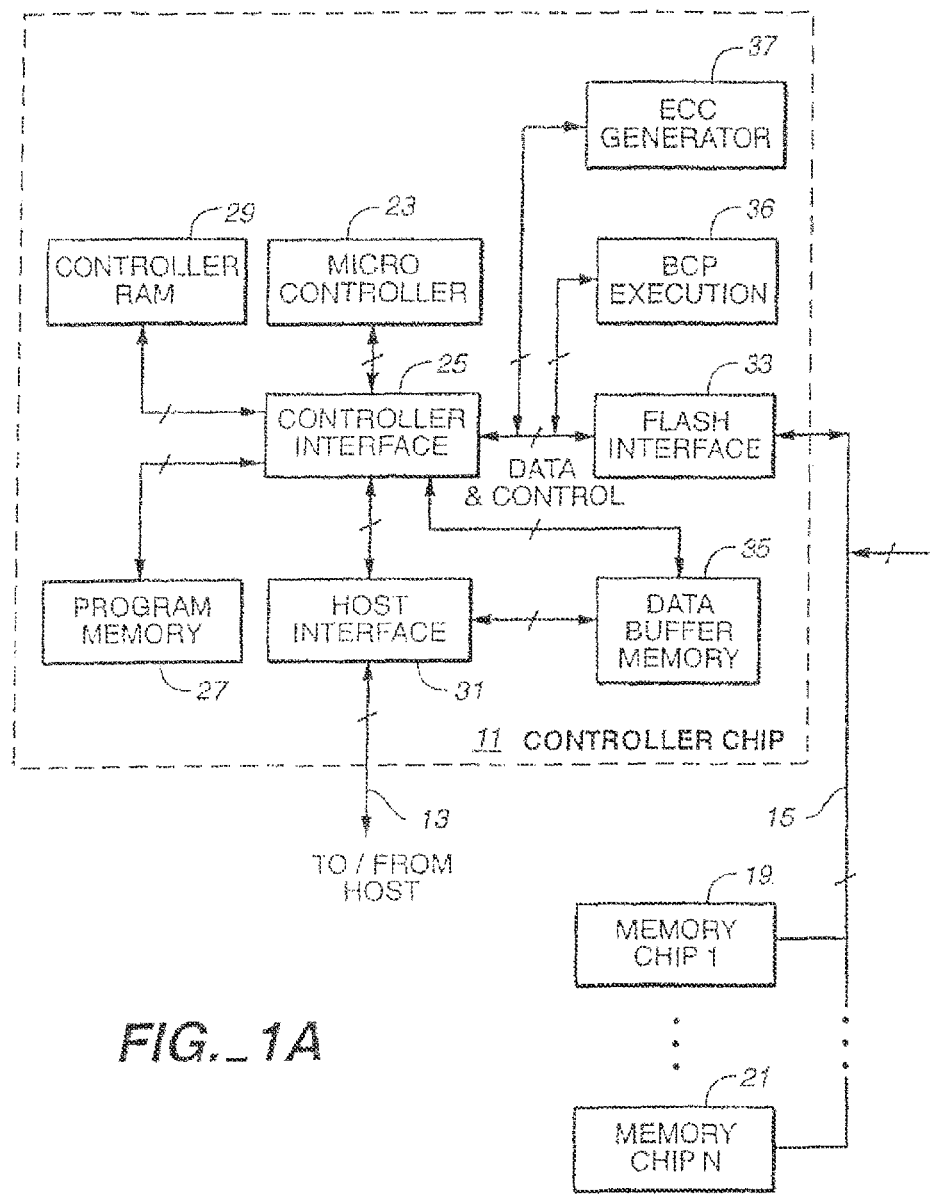
FIG._1A
FIG._1A | FIG._1B
FIG._1

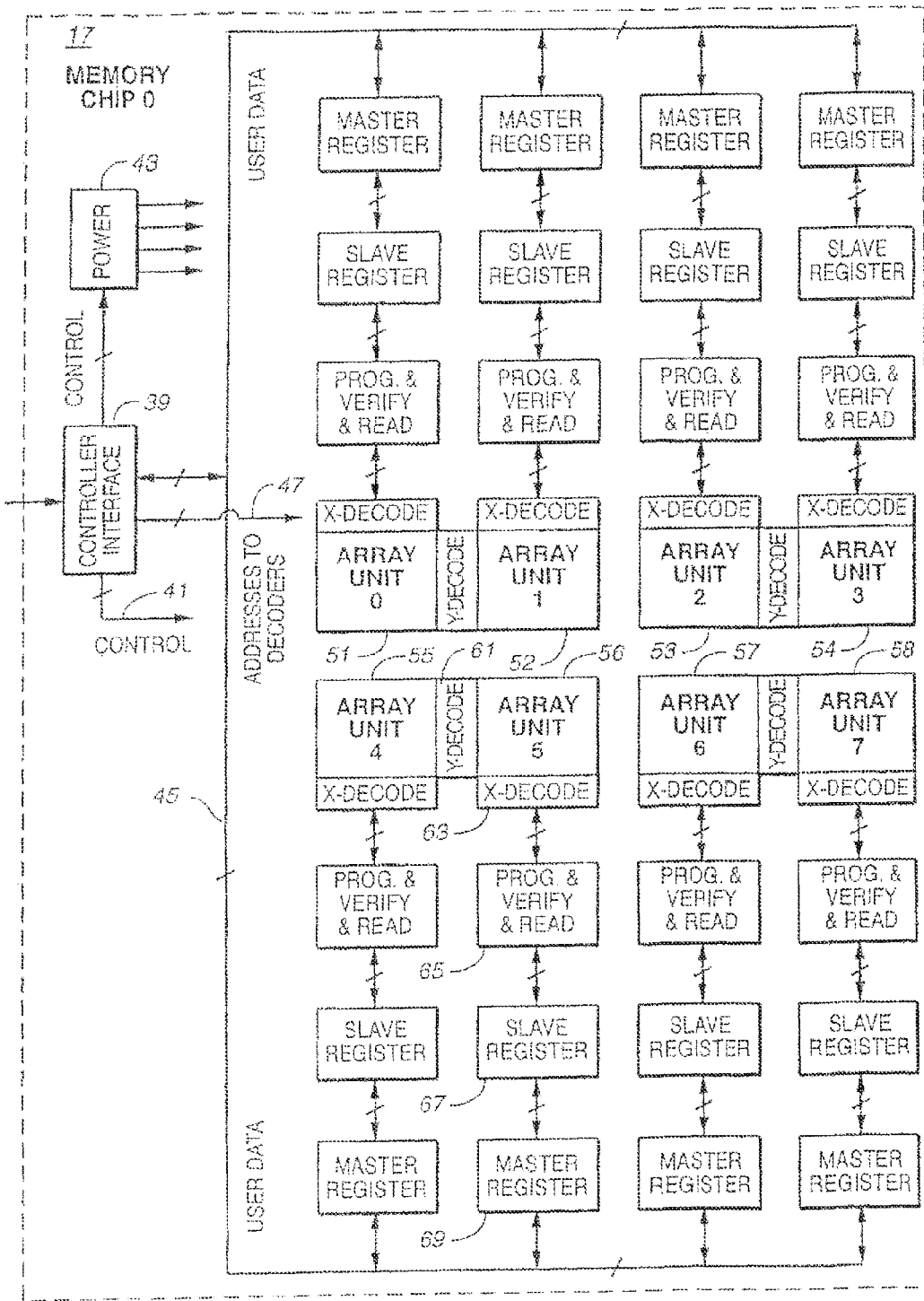
FIG._1B

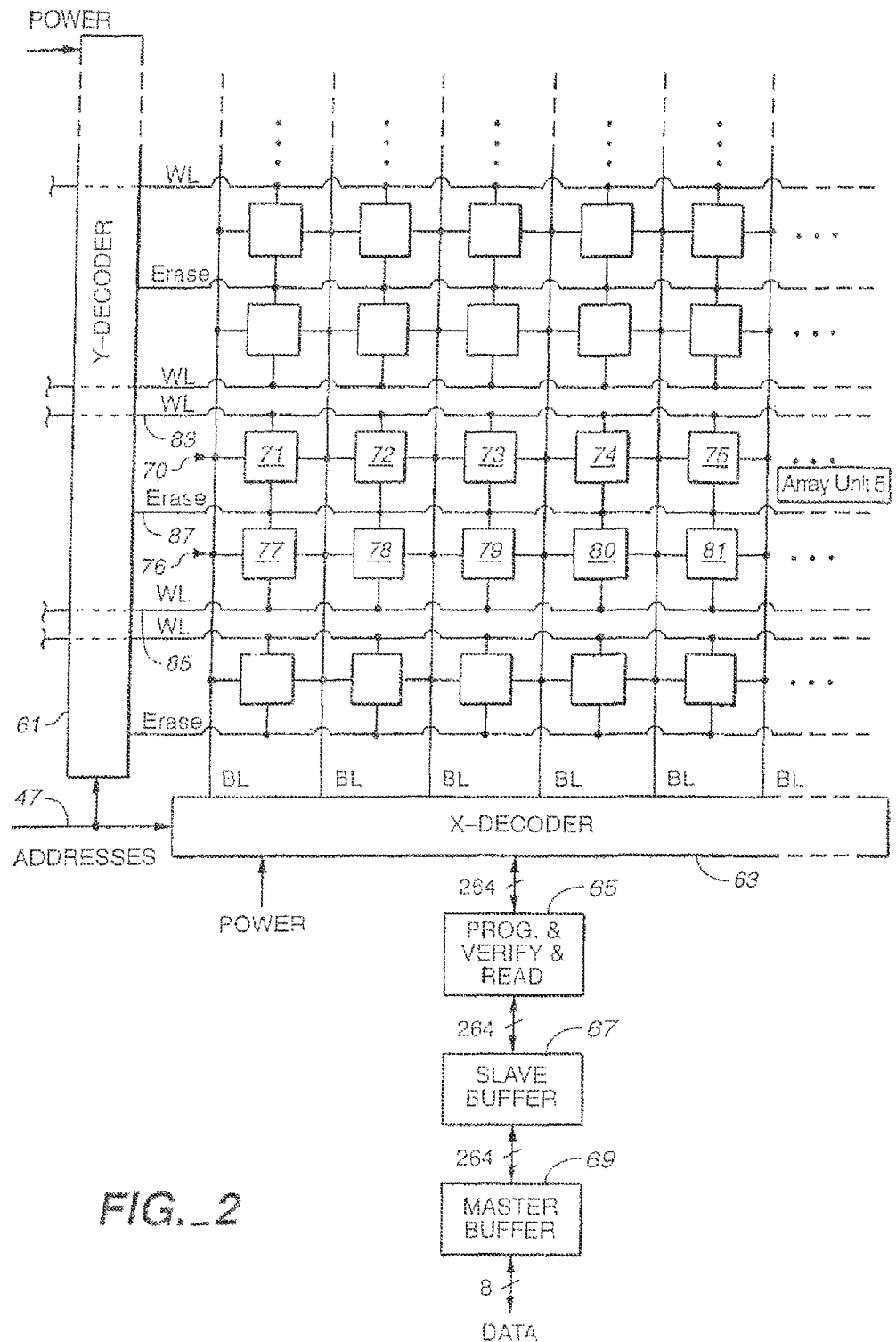
FIG._2

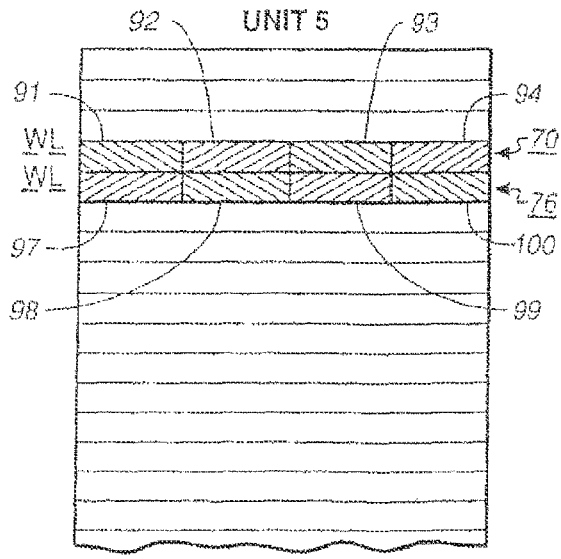
FIG._3A
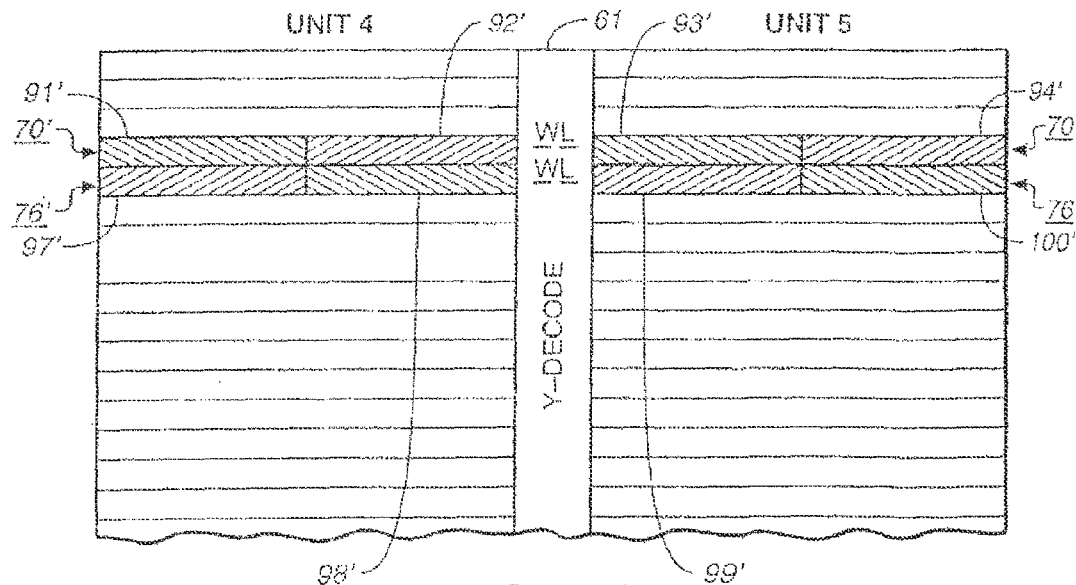
FIG._3B
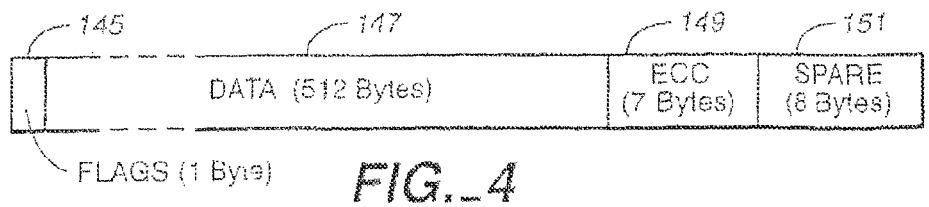
FIG._4

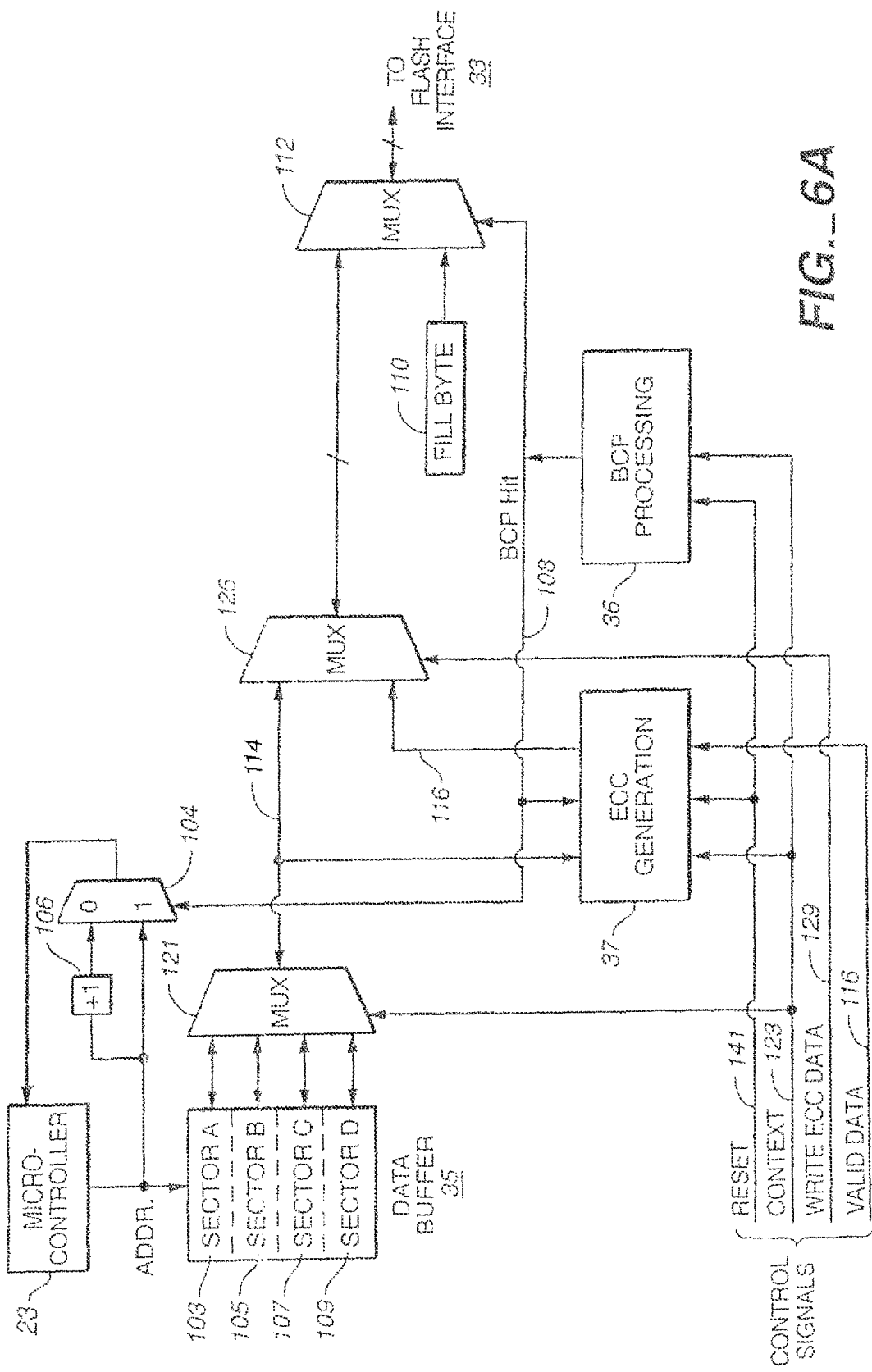
FIG._6A

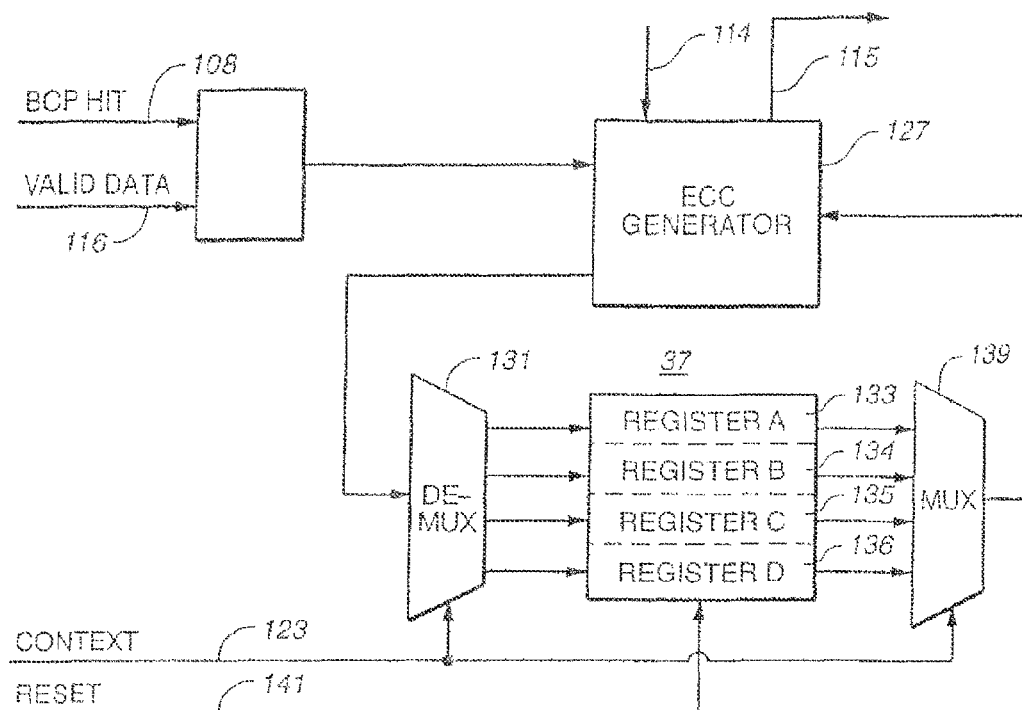
FIG._6B
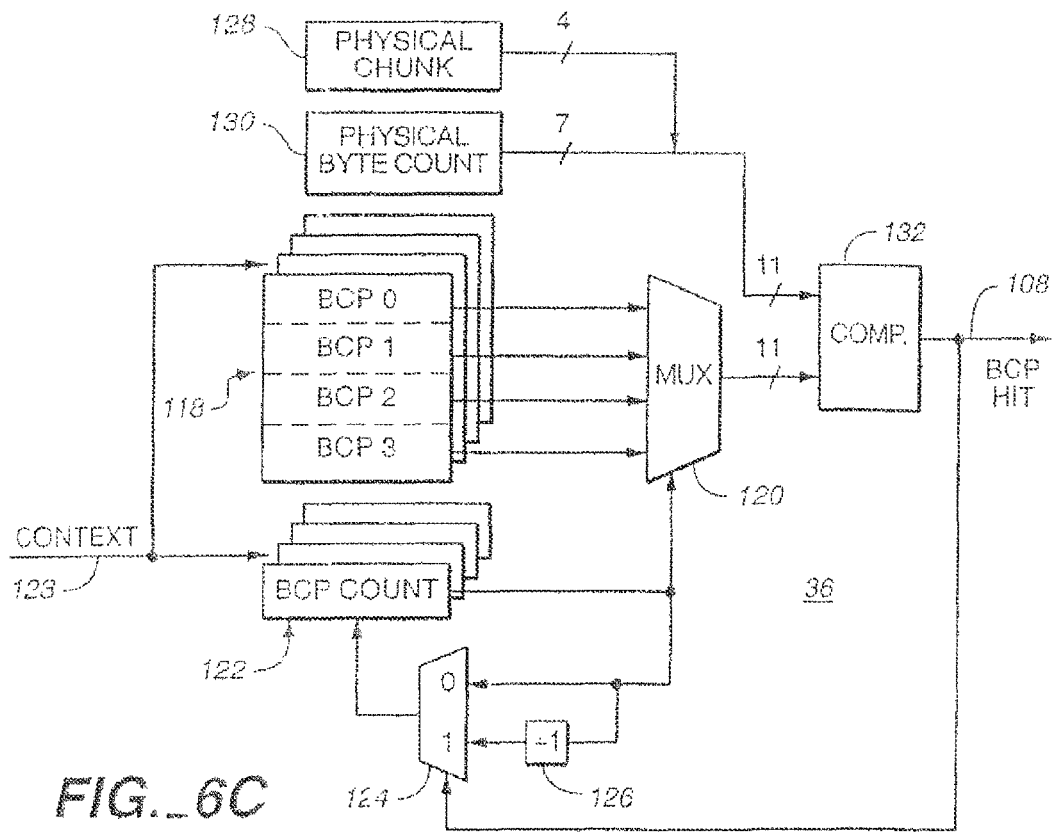
FIG._6C

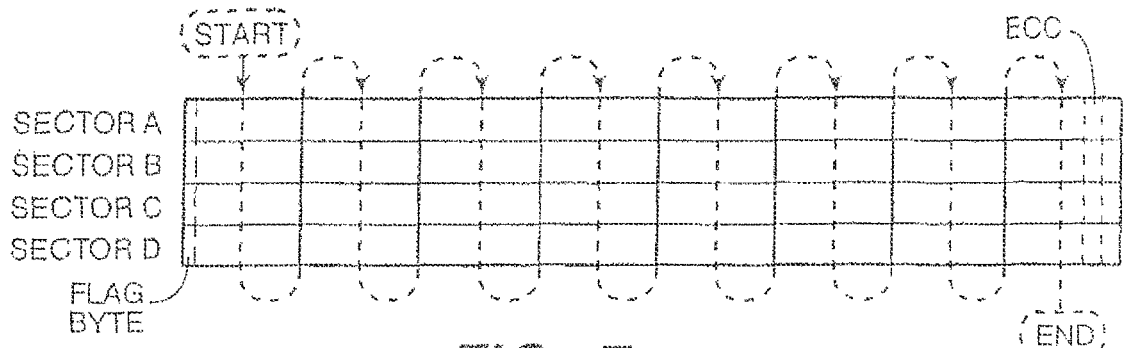
FIG._7
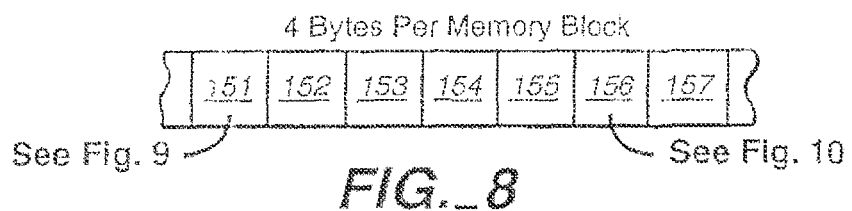
FIG._8
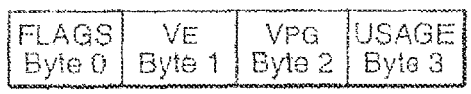
FIG._9
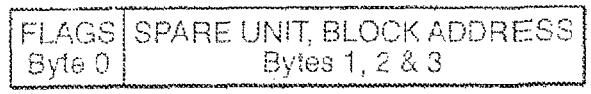
FIG._10

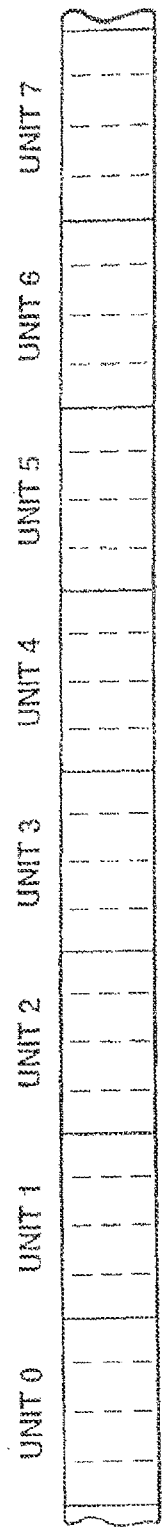
FIG._11
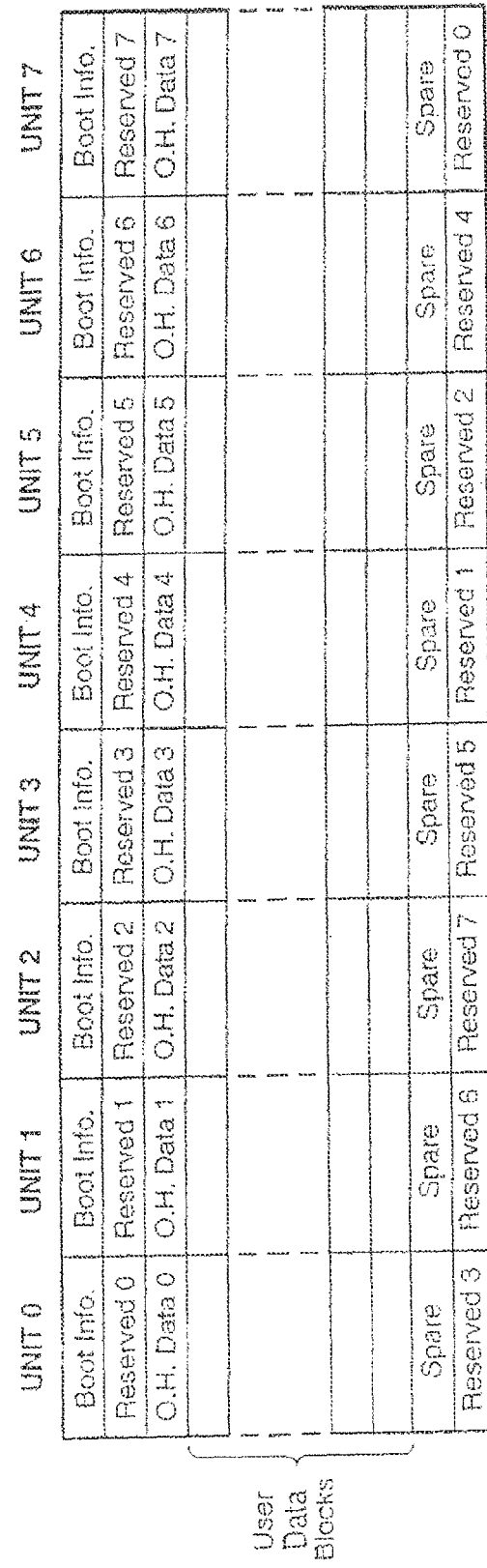
FIG._12

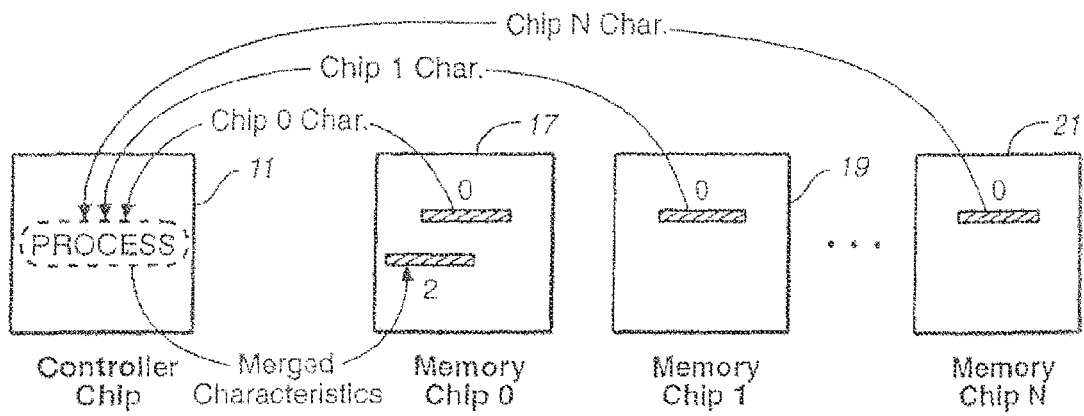
FIG._13
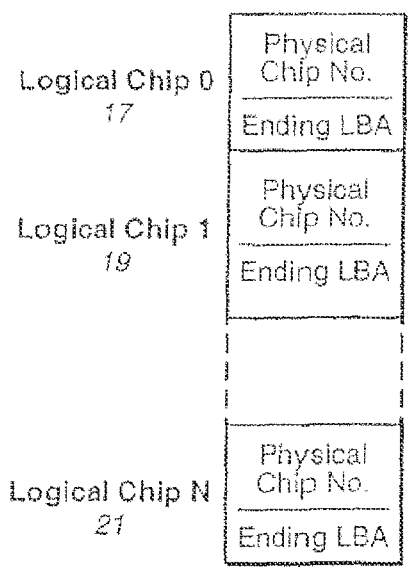
FIG._14
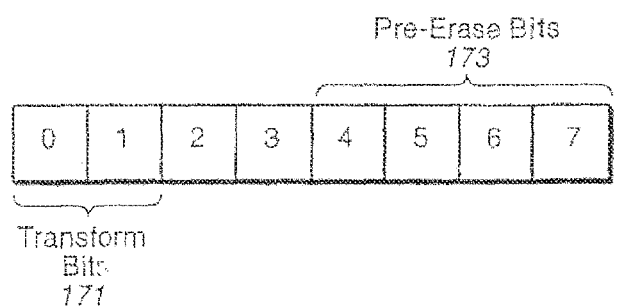
FIG._15

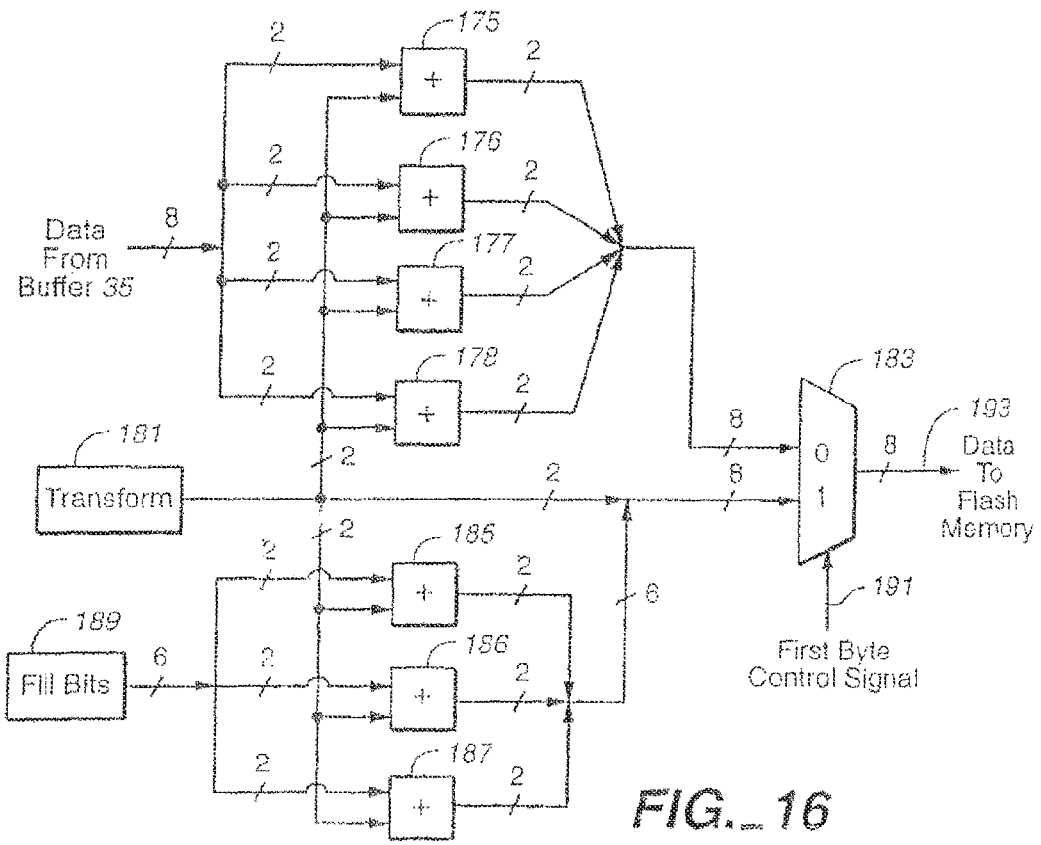
FIG._16
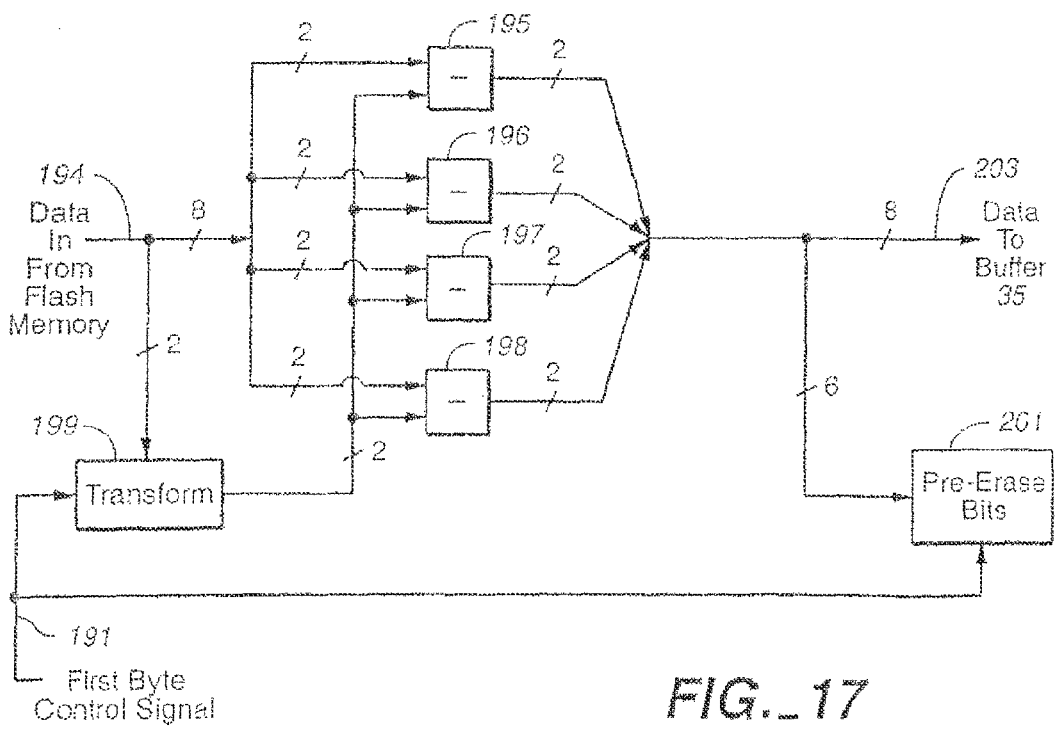
FIG._17

FLASH EEPROM SYSTEM WITH SIMULTANEOUS MULTIPLE DATA SECTOR PROGRAMMING AND STORAGE OF PHYSICAL BLOCK CHARACTERISTICS IN OTHER DESIGNATED BLOCKS

CROSS REFERENCE TO RELATED APPLICATIONS

This application is a continuation of application Ser. No. 13/550,157, filed Jul. 16, 2012, which is a continuation of application Ser. No. 13/027,055, filed Feb. 14, 2011, now U.S. Pat. No. 8,223,547, which is a continuation of application Ser. No. 12/624,258, filed on Nov. 23, 2009, which is a division of application Ser. No. 12/403,014, filed on Mar. 12, 2009, now U.S. Pat. No. 7,646,667, issued on Jan. 12, 2010, which is a division of application Ser. No. 12/061,020, filed on Apr. 2, 2008, now U.S. Pat. No. 7,532,511, issued on May 12, 2009, which is a continuation of application Ser. No. 11/679,012, filed on Feb. 26, 2007, now U.S. Pat. No. 7,362,613, issued on Apr. 22, 2008, which is a continuation of application Ser. No. 11/323,576, filed Dec. 29, 2005, now U.S. Pat. No. 7,184,306, issued on Feb. 27, 2007, which is a continuation of application Ser. No. 10/841,406, filed May 6, 2004, now U.S. Pat. No. 6,996,008, issued on Feb. 7, 2006, which is a continuation of application Ser. No. 10/422,216, filed Apr. 23, 2003, now U.S. Pat. No. 6,760,255, issued on Jul. 6, 2004, which is a continuation of application Ser. No. 10/176,880, filed Jun. 21, 2002, now U.S. Pat. No. 6,580,638, issued on Jun. 17, 2003, which is a continuation of application Ser. No. 09/505,555, filed Feb. 17, 2000, now U.S. Pat. No. 6,426,893, issued on Jul. 30, 2002, which applications are incorporated herein in their entirety by this reference. This application is also related to application Ser. No. 12/402,955, filed on Mar. 12, 2009, now U.S. Pat. No. 7,646,666, issued on Jan. 12, 2010. This application is also related to application Ser. No. 12/611,280, filed on Nov. 3, 2009.

BACKGROUND OF THE INVENTION

This invention relates to semiconductor memory systems, particularly to non-volatile memory systems, and have application to flash electrically-erasable and programmable read-only memories (EEPROMs).

Flash EEPROM systems are being applied to a number of applications, particularly when packaged in an enclosed card that is removably connected with a host system. Current commercial memory card formats include that of the Personal Computer Memory Card International Association (PCMCIA), CompactFlash (CF), MultiMediaCard (MMC) and Secure Digital (SD). One supplier of these cards is SanDisk Corporation, assignee of this application. Host systems with which such cards are used include personal computers, notebook computers, hand held computing devices, cameras, audio reproducing devices, and the like. Flash EEPROM systems are also utilized as bulk mass storage embedded in host systems.

Such non-volatile memory systems include an array of floating-gate memory cells and a system controller. The controller manages communication with the host system and operation of the memory cell array to store and retrieve user data. The memory cells are grouped together into blocks of cells, a block of cells being the smallest grouping of cells that are simultaneously erasable. Prior to writing data into one or more blocks of cells, those blocks of cells are erased. User data are typically transferred between the host and memory array in sectors. A sector of user data can be any amount that is convenient to handle, preferably less than the capacity of the memory block, often being equal to the standard disk drive sector size, 512 bytes. In one commercial architecture, the memory system block is sized to store one sector of user data plus overhead data, the overhead data including information such as an error correction code (ECC) for the user data stored in the block, a history of use of the block, defects and other physical information of the memory cell block. Various implementations of this type of non-volatile memory system are described in the following United States patents and pending applications assigned to SanDisk Corporation, each of which is incorporated herein in its entirety by this reference: U.S. Pat. Nos. 5,172,338, 5,602,987, 5,315,541, 5,200,959, 5,270,979, 5,428,621, 5,663,901, 5,532,962, 5,430,859 and 5,712,180, and application Ser. No. 08/910,947, filed Aug. 7, 1997, now U.S. Pat. No. 6,222,762, and Ser. No. 09/343,328, filed Jun. 30, 1999, now U.S. Pat. No. 6,151,248. Another type of non-volatile memory system utilizes a larger memory cell block size that stores multiple sectors of user data.

One architecture of the memory cell array conveniently forms a block from one or two rows of memory cells that are within a sub-array or other unit of cells and which share a common erase gate. U.S. Pat. Nos. 5,677,872 and 5,712,179 of SanDisk Corporation, which are incorporated herein in their entirety, give examples of this architecture. Although it is currently most common to store one bit of data in each floating gate cell by defining only two programmed threshold levels, the trend is to store more than one bit of data in each cell by establishing more than two floating-gate transistor threshold ranges. A memory system that stores two bits of data per floating gate (four threshold level ranges or states) is currently available, with three bits per cell (eight threshold level ranges or states) and four bits per cell (sixteen threshold level ranges) being contemplated for future systems. Of course, the number of memory cells required to store a sector of data goes down as the number of bits stored in each cell goes up. This trend, combined with a scaling of the array resulting from improvements in cell structure and general semiconductor processing, makes it practical to form a memory cell block in a segmented portion of a row of cells. The block structure can also be formed to enable selection of operation of each of the memory cells in two states (one data bit per cell) or in some multiple such as four states (two data bits per cell), as described in SanDisk Corporation U.S. Pat. No. 5,930,167, which is incorporated herein in its entirety by this reference.

Since the programming of data into floating-gate memory cells can take significant amounts of time, a large number of memory cells in a row are typically programmed at the same time. But increases in this parallelism causes increased power requirements and potential disturbances of charges of adjacent cells or interaction between them. U.S. Pat. No. 5,890,192 of SanDisk Corporation, which is incorporated herein in its entirety, describes a system that minimizes these effects by simultaneously programming multiple chunks of data into different blocks of cells located in different operational memory cell units (sub-arrays).

SUMMARY OF THE INVENTION

There are several different aspects of the present invention that provide improvements in solid state memory systems, including those described above. Each of these aspects of the present invention, the major ones being generally and briefly summarized in the following paragraphs, may be implemented individually or in various combinations.

Multiple user data sectors are programmed into a like number of memory blocks located in different units or sub-arrays of the memory array by alternately streaming data from one of the multiple sectors at a time into the array until a chunk of data is accumulated for each of multiple data sectors, after which the chunks are simultaneously and individually stored in respective blocks in different units of the memory. This increases the number of memory cells that may be programmed in parallel without adverse effects.

An error correction code (ECC), or other type of redundancy code, may be generated by the controller from the streaming user data during programming and written into the same memory block as the user data from which it is generated. The redundancy code is then evaluated by the controller when the sector of data is read out of the memory block. A single redundancy code generation circuit is utilized, even when the streaming data is alternated between data chunks of the multiple sectors, by providing a separate storage element for each of the user data sectors being programmed at the same time, in which intermediate results of the generation are temporarily stored for each sector.

Overhead data of the condition, characteristics, status, and the like, of the individual blocks are stored together in other blocks provided in the array for this purpose. Each overhead data record may include an indication of how many times the block has been programmed and erased, voltage levels to be used for programming and/or erasing the block, whether the block is defective or not, and, if so, an address of a substitute good block, and the like. A group of blocks are devoted to storing such records. A large number of such records are stored in each of these overhead blocks. When accessing a specific user data block to perform one or all of programming, reading or erasing, the overhead record for that user data block is first read and its information used in accessing the block. By storing a block's overhead data outside of that block, frequent rewriting of the overhead data, each time the user data is rewritten into the block, is avoided. It also reduces the amount of time necessary to access and read the block overhead data when the block is being accessed to read or write user data. Further, only one ECC, or other redundancy code, need be generated for the large number of overhead records that are stored in this way.

The records from a number of overhead blocks can be read by the controller into an available portion of its random-access memory for ease of use, with those overhead blocks whose records have not been accessed for a time being replaced by more active overhead blocks in a cache-like manner. When a beginning address and number of sectors of data to be transferred is received by the memory controller from the host system, a logical address of the first memory block which is to be accessed is calculated in order to access the overhead record for that block but thereafter the overhead records are accessed in order without having to make a calculation of each of their addresses. This increases the speed of accessing a number of blocks.

Information of defects in the memory, such as those discovered during the manufacturing process, may also be stored in separate blocks devoted for this purpose and used by the controller so that the imperfect memory circuit chips may be included in the memory system rather than discarding them. This is particularly an advantage when a single defect record affects many blocks. One such defect is a bad column that is shared by a large number of blocks. A number of bad column pointers (BCPs) may be stored together as a table in one or more sectors that are devoted in part or entirely to this overhead data. When this is done, the physical location of the streaming user data being written to the memory is shifted when a comparison of the relative physical location within a sector of individual bytes of data with the BCP table indicates that the data byte is being directed to at least one memory cell that is along a bad column. The reverse is performed during reading, where data bits read from memory cells that were skipped over during write because of a bad column are ignored.

Since flash EEPROM cells have, by their nature, a limited life in terms of the number of times that they can be erased and reprogrammed, it is usually prudent to include one or more operational features that tend to even out the wear on the various memory blocks that can be caused by multiple rewrites to the same blocks. One such technique alters from time-to-time the correspondence between the digital data and the memory states that are designated to represent the digital data. To accomplish this in the present memory system, the first one or few bits of the initial byte of the individual sectors of data, termed herein as a flag byte, are used to designate such correspondence. These bits are designated upon writing user data, and all data following the initial bits are transformed on the fly as the streaming data is being transferred to the memory array in accordance with their value. Upon reading a sector of data, these initial bit(s) are read and used to transform back all subsequent data stored in the sector to their original values as the data are being read out of the memory in a stream.

When the memory system is formed of multiple memory cell arrays, such as by using two or more integrated circuit chips that each include such an array, the system's manufacture and use is simplified by accumulating information about each of the memory arrays in the system, and then storing that information as a single record in some convenient location, such as in one of the blocks of one of the memory arrays. This makes it much easier to combine memory arrays having different sizes and/or operating characteristics into a single system. One such record merges the number of blocks of user data available in each of the memory chips in a way that establishes a continuum of logical block addresses of the blocks of all the arrays in the system. When a location of memory is being accessed for a read or write operation, the memory controller then accesses the merged record in a process of converting a logical block address to a physical address of a block in one of the memory arrays.

Such a merged record can be automatically generated and stored during manufacturing by the controller reading the information from each of the memory arrays, merging that information into a single record, and then writing that record into a designated block of one of the memory arrays. Currently, the memory controller is usually provided on a separate integrated circuit chip, with one or more memory cell array chips connected with the controller. It is contemplated, in light of continuing processing technology improvements, that a memory array can also be included on the controller chip. When that amount of memory is insufficient for a particular system, one or more additional circuit chips containing further memory array(s) are then utilized. When two or more physically separate arrays of included in a system, then the generation of the merged record simplifies operation of the controller to address blocks across multiple arrays.

Other characteristics of various memory array circuit chips used to form a system, such as optimal voltage ranges, timing, numbers of pulses used, characteristics of voltage pumps, locations of overhead blocks, and the like, can vary without adverse effects. These operating characteristics can also be tabulated into a single system file for access by the micro-controller, or, more conveniently, the micro-controller can be operated to first access those of such characteristics as are necessary from an individual memory array chip before accessing that chip to read or write data. In either case, this allows the memory system to be formed with memory chips having different characteristics without any degradation in its performance. The manufacturing of non-volatile memory systems is simplified since all the memory array chips in a system need not be the selected to be the same.

Additional aspects, features and advantages of the present invention are included in the following description of specific embodiments, which description should be taken in conjunction with the accompanying drawings.

BRIEF DESCRIPTION OF THE DRAWINGS

FIG. 1 is a block schematic diagram of an example non-volatile memory system in which various aspects of the present invention may be implemented; FIG. 1 consists of two linked components, depicted respectively in FIG. 1A and FIG. 1B;

FIG. 2 is a more detailed schematic diagram of one of the memory cell array units, with associated logic and buffers, of the system of FIG. 1;

FIGS. 3A and 3B illustrate four state and two state operation, respectively, of the individual memory cells of the system of FIG. 1;

FIG. 4 is an example of the content and structure of data stored in one of the memory blocks of the system of FIG. 1;

FIG. 6A is a schematic block diagram of the circuit of the system of FIG. 1 that utilizes bad column pointers (BCP) and generates an error correction code (ECC), or other data redundancy code, with the multi-sector streaming data being transferred to the memory cell array;

FIG. 6B is a schematic diagram of the ECC generation block of FIG. 6A;

FIG. 6C is a schematic diagram of the BCP processing block of FIG. 6A;

FIG. 7 illustrates the manner in which data from multiple sectors is transferred to the memory cell array;

FIG. 8 illustrates an example data structure of block overhead data records;

FIG. 9 shows an example of an overhead data record of FIG. 8 for a good memory cell block;

FIG. 10 shows an example of an overhead data record of FIG. 8 for a defective memory cell block;

FIG. 11 illustrates an example data structure of a reserved block that stores records of defects of the memory cell array, namely the location of bad columns, of the system of FIG. 1;

FIG. 12 shows an example of the physical partitioning of the memory array of FIG. 1 into units and blocks of memory cells, and the data that is designated to be stored in them;

FIG. 13 schematically illustrates a method of forming a merged record of the characteristics of multiple memory integrated circuit chips of the system of FIG. 1;

FIG. 14 shows an example of a merged record formed in the manner illustrated in FIG. 13;

FIG. 15 illustrates an example of bit fields of the flag byte of the data sector of FIG. 4;

FIG. 16 schematically shows generation and use of the bit fields of the flag byte of FIG. 15 during writing of data in the memory; and FIG. 17 schematically shows use of the bit fields of the flag byte of FIG. 15 during reading of data from the memory.

DESCRIPTION OF REPRESENTATIVE EMBODIMENTS

Figure 5:
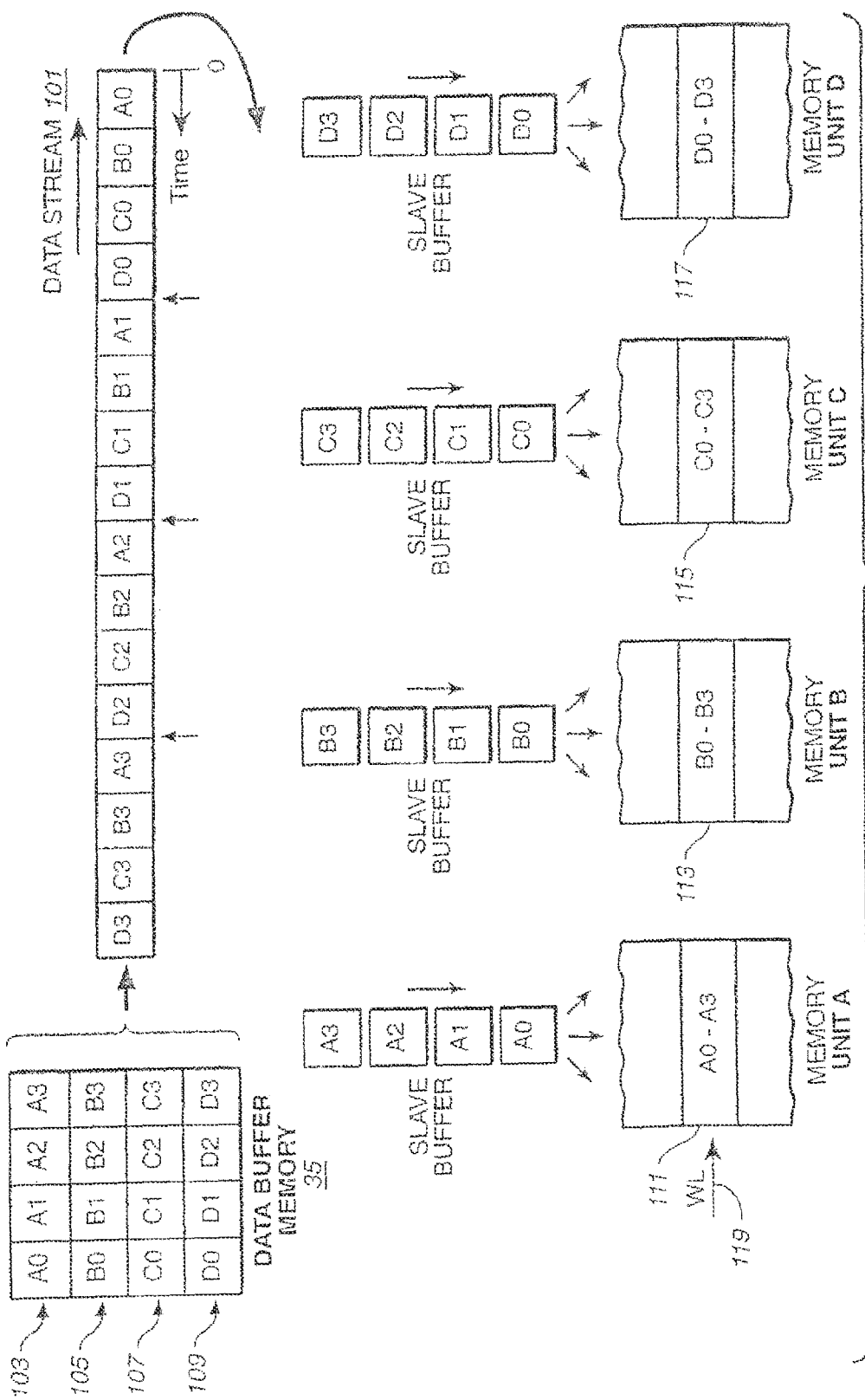
FIG. 5 illustrates streaming data transfer during programming of multiple sectors of data at one time within the memory system of FIG. 1.

FIG. 1 provides a diagram of the major components of a non-volatile memory system that are relevant to the present invention. FIG. 1 consists of two linked components, depicted respectively in FIG. 1A and FIG. 1B. A controller 11 communicates with a host system over lines 13. The controller 11, illustrated to occupy one integrated circuit chip, communicates over lines 15 to one or more non-volatile memory cell arrays, three arrays 17, 19 and 21 being illustrated, each of the arrays usually formed on one or more separate integrated circuit chips. The illustrated controller is usually contained on a single integrated circuit chip, either without a flash EEPROM array (the example shown) or with a memory cell array. Even if a memory cell array is included on the controller circuit chip, an additional one or more chips that each contain only a memory array and associated circuitry will often be included in the system.

User data is transferred between the controller 11 and multiple memory arrays 17, 19 and 21, in this example, over the lines 15. The memory arrays are individually addressed by the controller. Specifically, the data bus within the lines 15 can be one byte wide. The memory system shown in FIG. 1 can be embedded as part of a host system or packaged into a card, such as a card following one of the card standards previously mentioned. In the case of a card, the lines 13 terminate in external terminals on the card for mating with a complementary socket within a host system. Although use of one controller chip and multiple memory chips is typical, the trend is, of course, to use fewer separate chips for such a system by combining their circuits. An example capacity of one of the illustrated memory chips is 256 Mbits, thus requiring only two such memory chips, plus the controller chip, to form a non-volatile memory system having a data capacity of 64 megabytes. Use of a single smaller capacity memory chip results in a memory system of lesser capacity, an 8 megabyte system being a marketable example. Conversely, use of memory chips with a higher bit storage density and/or use of more memory array chips in a system will result in a higher capacity memory. Such memory systems up to 1.3 gigabyte and more are possible.

The controller 11 includes a micro-processor or micro-controller 23 connected through controller interface logic 25 to internal memories and interfaces with external components. A program memory 27 stores the firmware and software accessed by the micro-controller 23 to control the memory system operation to read data from the connected memory array(s) and transmit that data to the host, to write data from the host to the memory chip(s), and to carry out numerous other monitoring and controlling functions. The memory 27 can be a volatile re-programmable random-access-memory (RAM), a non-volatile memory that is not re-programmable (ROM), a one-time programmable memory (OTP) or a re-programmable flash EEPROM system. If the memory 27 is re-programmable, the controller can be configured to allow the host system to program it. A random-access-memory (RAM) 29 is used to store, among other data, data from tables read from the non-volatile memory that are accessed during reading and writing operations.

A logic circuit 31 interfaces with the host communication lines 13, while another logic circuit 33 interfaces with the memory array(s) through the lines 15. Another memory 35 is used as a buffer to temporarily store user data being transferred between the host system and non-volatile memory. The memories in the controller are usually volatile, since memories with fast access and other characteristics desired for efficient controller access have that characteristic, and may be combined physically into a single memory. A dedicated circuit 36 accesses the streaming user data being transferred to the memory and inserts dummy bytes into the data stream in order to avoid writing valid user data to memory cells in bad columns. A dedicated processing circuit 37 also accesses the streaming user data being transferred between the controller and flash interfaces 25 and 33 for generating an ECC, or other type of redundancy code, based upon the user data. When user data is being transferred into the non-volatile memory, the generated ECC is appended onto the user data and simultaneously written into the same physical block of the non-volatile memory as part of the same sector as the user data. The circuits 36 and 37 are described further below, with respect to FIGS. 6A-C.

The non-volatile memory chip 17 includes a logic circuit 39 for interfacing with the controller through the lines 15. Additional components of the memory chip are not shown for simplicity in explanation. The purpose of the logic circuit 39 is to generate signals in separate buses and control lines. Various control signals are provided in lines 41 and a power supply 43 to the memory array circuits is also controlled through the interface 39. A data bus 45 carries user data being programmed into or read from the non-volatile memory, and an address bus 47 carries the addresses of the portion of the memory being accessed for reading user data, writing user data or erasing blocks of memory cells.

The floating gate memory cell array of a single non-volatile memory chip is itself divided into a number of units that each have its own set of supporting circuits for addressing, decoding, reading and the like. In this example, eight such array units 0-7, denoted by reference numbers 51-58, are illustrated. Physically, as an example, the memory array on a single chip is divided into quadrants, each quadrant including two units that are in part connected together and share a common word line decoding circuit (y-decode), such as a y-decoder 61 between memory cell units 4 (55) and 5 (56). This memory architecture is similar to that described in aforementioned U.S. Pat. No. 5,890,192, except there are eight units instead of the four units (quads) illustrated in that patent.

Each of the array units has a bit line decoder (x-decode), such as x-decoder 63 connected to the array unit 5 (56), through which user data is read. FIG. 2 is an expanded view of the array unit 5 and its decoders 61 and 63 that respond to addresses on the address bus 47. Connected to the decoder 63 is a circuit 65 that contains sense amplifiers for reading data, a register for storing data being programmed, comparators used during programming to determine whether addressed cells in the unit 5 have been programmed to the desired state and during reading to determine the states of the cells being read, and control logic to carry out these functions. Two registers 67 and 69 are connected for parallel transfer of user data between them during reading (from 67 to 69) and programming (from 69 to 67). User data is transferred from the data bus 45 and the register 69, one byte at a time, during writing and in the other direction during reading. Each of the other seven array units are similarly connected.

Referring specifically to FIG. 2, a portion of an example memory cell array is generally described with respect to the array unit 5. Each row of cells has its own conductive word line (WL) connected through the decoder 61 to corresponding word lines of the adjacent array unit 4. Each of two partial rows 70 and 76 of respective floating gate memory cells 71-75 and 77-81, for example, has its own respective word line 83 and 85. A word line is connected to a gate of each of the cells in a single row, the connected gate being a select gate in a memory cell having a split channel type of structure. Other memory cell structures can be used instead, each having at least one electrically floating gate upon which a level of stored charge is a measure of the state of the cell. A conductive erase line is provided between every other row of memory cells, the line 87 being connected to erase gates of each of the memory cells of each of the rows 70 and 76. Alternate structures do not erase the floating gates to a separate erase gate but rather erase to a region of the substrate such as the cell source diffusions. Bit lines (BL) extend in an orthogonal direction to the word lines, one bit line between each column of array cells, and are connected to the decoder 63. Each bit line is connected to the source and drain diffusions of each of the cells of the columns on either side of the bit line. Detailed examples of suitable memory arrays are described in the U.S. patents listed in the Background section above but other existing and proposed structures can alternatively be employed in implementations of the present invention.

A block of cells is formed, in the array example being described, from each pair of rows that surround an erase gate, such as the rows 70 and 76 of the array unit 5 (FIG. 2) on either side of the erase gate 87, when operating each floating gate in four defined threshold voltage states in order to store two bits of data per floating gate. This is illustrated more generally in FIG. 3A, where the block formed of rows 70 and 76 contains a sector's worth of data from the host, plus some overhead information about that data. In a very specific example, the individual blocks are sized to have a capacity of 528 bytes in order to store one 512 byte sector of data, some overhead information about the data and provide some spare bytes, as illustrated in FIG. 4. When each floating gate is capable of storing two bits of data, as is the case illustrated in FIG. 3A, each block contains 264 floating gates, or 132 in each of the block's two rows. If the memory cell structure has one floating gate per cell formed between source and drain diffusions, then 132 cells are included in each row of each one of the units. But if the cells each have two floating gates, then only 66 cells are necessary in each row.

If, rather than storing two bits of data per floating gate, only one bit is stored per floating gate, twice the number of cells are needed for each operable block. This can be accomplished, in effect, by doubling the length of each row in a manner illustrated in FIG. 3B. The rows 70 and 76 are extended to include the respective rows 70' and 76' of the adjacent unit 4 with which unit 5 is paired. The word line of row 70' of the unit 4 is connected through the decoder 61 to the word line of the row 70 of the unit 5, and the word line of the row 76 is connected to the row 76' of unit 5. When a given row's word line is addressed, both components of the word line, in adjacent units 4 and 5, are addressed together. The common erase gate for the rows 70 and 76 is also connected through the decoder 61 to a common erase gate for the rows 70' and 76', in order to cause all of the cells formed of the enlarged block of cells of the rows 70, 70', 76 and 76' to be erased together. Therefore, when operating the memory array floating gates with only two threshold states, the eight units of the array being described are reduced to four operating quadrants that are each formed of adjacent pairs of units (0-1, 2-3, 4-5 and 6-7). This allows the memory array of FIG. 1 to be operated in either of two or four states, according to a command set by the manufacturer, when a proper set of reference threshold levels are also set for program-verify and reading in each unit's circuits 65.

As an alternative to the two state configuration shown in FIG. 3B, a single block may be formed of rows that are all within a single unit, such as four rows that are contiguous with each other.

Data is preferably transferred in chunks between the controller buffer memory 35 (FIG. 1) and an addressed block of the array memory cells. In a specific example, each chunk contains 66 bytes of data. A chunk of data is programmed to the cells in an addressed block, one time in parallel. When operating in four states, chunks of data 91-94 are stored in one row of a typical block (FIG. 3A), and chunks of data 97-100 are stored in the second row of cells of that block. When the memory is operated in two states, individual chunks of data 91'-94' are stored one of the extended rows of cells (FIG. 3B), and chunks 97'-100' in the other row of the expanded block of cells that extends across two adjacent units.

Rather than transferring a chunk of user data in parallel between the buffer memory 35 and one of the memory arrays, a data bus within the lines 15 is designed to carry only a few bits data in parallel, one byte in a specific example. This reduces the number of lines 15 that are necessary and, more importantly, reduces the number of user data pads that need to be included on each of the memory array chips in the system. With one byte being transferred at a time, there thus needs to be 66 such transfers for each chunk. These byte wide user data transfers extend between the buffer memory 35 and, through interface circuits 33 and 39, the memory cell array master register 69, if a block within the array unit 5 is being addressed, or another of the array master registers associated with another unit if a block within that other unit is being addressed.

During programming, bytes of a sector of user data received from the host system are successively transferred into the memory array master register one at a time until a chunk of data has been accumulated, and then the chunk is transferred in parallel to the slave register (such as register 67 for the array unit 5). As the chunk is being transferred out of the master register and into the slave register, bytes of the next chunk of the sector are being transferred into the master register. Chunks are transferred in parallel, one at a time from the slave register, to programming and verifying circuits (circuit 65 for the array unit 5), which causes the a number of memory cells of an addressed block of the associated array unit to be programmed to their respective target threshold levels. The loading of one chunk into the master register preferably overlaps programming of the previous chunk of data from the slave register by the programming and verifying circuits.

During reading, the process is reversed, memory cell threshold values representative of a chunk of data being read one at a time from one of the array units into its reading circuit (circuit 65 for the array unit 5) where the stored values are converted into data bits. Those successive chunks of data are then transferred one at a time into the slave register for the array unit, thereafter in parallel to the master register, and then one byte at a time over the lines 15 to the data buffer 35 of the controller for transfer to the host system. As a chunk is being transferred out of the master register and to the controller, a new chunk of data is being transferred into the slave register from the read circuits.

Rather than completing the transfer of chunks of data of one sector before commencing another, it is preferred to alternately transfer chunks of multiple sectors between the buffer memory 35 and different ones of the array units 0-7. This is illustrated in FIG. 5, where data from four sectors is transferred in a common data stream 101. Memory array units A, B, C and D can be any four of the array units 0-7 of the system of FIG. 1. Chunks of data A0+, B0+, C0+ and D0+ are shown to be transferred in the data stream 101 from four respective data sectors 103, 105, 107 and 109 in the buffer memory 35 to the four different memory units A-D. The memory system can, of course, be alternatively designed to transfer fewer or more data sectors together to an equal number of memory cell units. For simplicity in illustration, each sector is shown in FIG. 5 to contain only four chunks (chunks A0, A1, A2 and A3 for the sector 103, for example), where the system of FIG. 1 has been described above to transfer eight chunks of data for each sector. The principle of operation is the same.

As illustrated in FIG. 5, the data stream 101, being transferred in the data bus of the lines 15, is formed from successive bytes of a first chunk A0 of the buffered data sector 103, followed by a first chunk B0 of the sector 105, then a first chunk C0 of the sector 107, and then a first chunk D0 of the sector 109. These chunks are initially stored in the master registers of the respective units to which the data are being written, transferred in parallel to the slave registers and then written in parallel into respective blocks 111, 113, 115 and 117 of the four memory cell units A-D. All of the chunks A0, B0, C0 and D0 are programmed at the same time into respective memory units A-D, followed by chunks A1, B1, C1 and D1, and so forth. The blocks where chunks of data are written either share a common word line 119 or have the same voltage impressed on the word lines of the addressed blocks. As the initial chunks of data are being transferred through the registers and programmed into the units, subsequent chunks A1, B1, C1 and D1 of the four data sectors are being transferred to the registers of the units. This is followed, in the data stream 101, by another chunk from each of the data sectors 103, 105, 107 and 109, and so forth, until all of the chunks of each of the four buffered data sectors has been programmed into the memory units A-D.

This programming technique has an advantage that multiple chunks of user data may be simultaneously programmed into different units of the memory on a single chip, or, alternatively, into different units spread among two or more memory chips. This is preferred to the simultaneous programming of multiple sectors of data into a common block of one unit since the cells being programmed are, by the technique of FIG. 5, physically and electrically separated further from each other. This separation reduces incidents of disturbing the charge on floating gates not intended to be altered. It also spreads out the power supply requirements on the chip. The technique of FIG. 5, which operates with memory blocks formed of contiguously positioned memory cells, is also preferred to defining memory blocks in segments across multiple memory units in order to simultaneously program multiple segments of the block without causing disturbs and having increased power requirements.

The technique of FIG. 5 has been described with the assumption that all of the multiple data sectors, four in that example, are written in full into the controller buffer 35 before transfer of their data in chunks to the flash memory is commenced. But this transfer can be commenced earlier if all four of the data sectors are being simultaneously written into the buffer memory 35, as can be done with the higher data transfer rates between the controller 11 and the host system. Alternatively, some additional parallelism can be included by loading the four data sectors 103, 105, 107 and 109 into the buffer memory 35 in a time shifted manner, such as by loading data of the chunk B0 from the sector 105 after the chunk of data A0 has been written and while it is being read out into the data stream 101, and so forth down the line through the data sectors 107 and 109. The data sectors are then loaded into the buffer 35 with a time shift of that necessary to load one chunk of such data. The generation of chunks of data within the stream 101 then needs to wait for only the first chunk of each data sector to be loaded into the buffer 35.

FIG. 6A is a block diagram of a circuit that may be included as part of the controller 11 of the FIG. 1 memory system in the path of user data being transferred in a stream between the interfaces 25 and 33 during both programming and reading. These circuits participate in carrying out the method described with respect to FIG. 5, and also generates and inserts into the data stream an ECC from the data being programmed (ECC generation 37) and make use of the BCPs to avoid writing user data to memory cells within bad columns (BCP processing 36). The micro-controller 23 addresses the buffer memory 109, one byte at a time in a predefined sequence. That sequence is altered by circuits 104 and 106 in response to a signal in a line 108 that indicates a byte address within the flash memory includes a bad column. A multiplexer 121 operates to supply bytes of data from one of sectors A, B, C or D at a time, in response to a control signal in lines 123, as one input to another multiplexer 125. Chunks of data are preferably read from the data sectors stored in the buffer memory 35 in the manner described above with respect to FIG. 5. A control signal 123 causes the multiplexer 121 to switch from one data sector to the next, in sequence, each time that a chunk's worth of data bytes has been read from the buffer 35.

The stream of user data bytes at the output of the multiplexer 121 is applied as one input to a multiplexer 125. The multiplexer 125 normally passes that data stream from lines 114 through its output to one input of another multiplexer 112 An exception is when all the user data bytes of a sector have been passed out of the buffer 35, at which time a final series of bytes containing an ECC code for the sector of user data is added onto the end of user data through lines 116. The output of the multiplexer 125 provides the byte wide stream of user data and overhead information of the data for writing into physical blocks of the non-volatile memory.

That stream of user data is normally passed, one byte at a time, through the multiplexer 112 to the flash memory. An exception to this is when a BCP hit signal in line 108 is active, indicating that the byte of user data is being directed to a location of the flash memory that includes a bad column. In that case, the address applied to the buffer 35 is not incremented by the micro-controller 23 but rather a fill byte contained in a register 110 is inserted into the data stream instead of the usual byte of user data. The next byte of user data from the buffer 35 is delayed until the next transfer cycle when the BCP hit signal is inactive. The bits of the fill byte within the register 110 can be written by the micro-controller 23. The output of the multiplexer 112 provides the byte wide stream of user data and overhead information of the data that is written into physical blocks of the non-volatile memory, as well as possible fill bytes to avoid the effects of bad columns. The memory system being described can operate without the circuit of FIG. 6A, or with one of the BCP processing 36 or the ECC generation 37 but not both, but it is preferred to include both functions as shown.

Referring to FIG. 6B, additional details of the ECC generation unit 37 of FIG. 6A are given. Even though four sectors of data are alternately being transferred in a byte wide data stream from the output of the multiplexer 112 into a single ECC generator circuit 127, the ECC generator 37 is able to generate an ECC separately for each data sector and append the generated code to the end of each sector's data in the last chunk that is sent to the non-volatile memory array for storage. This is done by use of separate registers 133, 134, 135 and 136 for each of the four data sectors being sent to the memory array at one time. A resulting generation is stored in one of these registers by a de-multiplexer 131 or some other effective switching logic. Similarly, the contents of an appropriate one of the registers is connected through a multiplexer 139 as an input to the ECC generation circuit 127. After each byte of data is input to the ECC generation circuit 127 from the buffer 35, that circuit uses an intermediate result of an ECC generation for the same respective data sector A, B, C or D that is stored in the respective one of the registers 133-135, along with the new byte of data, to generate a new intermediate result that is stored back into that same register. This use of the registers is controlled by their input de-multiplexer 131 and output multiplexer 139, which are caused by the control signal in lines 123 to step in sequence between registers in synchronism with the data selecting multiplexer 121. A standard ECC algorithm, such as the Reed-Solomon code, is implemented by the generation circuit 127.

In order to pause the ECC generator 127 when fill bytes are being inserted into the data stream by the BCP processing, the generator 127 is disabled by a combination of the BCP hit signal in the line 108 being active and a signal in the line 116 indicating that the data at the output of the multiplexer 121 is valid. A logic circuit 138 combines the signals 108 and 116 in order to generate a disable signal for the ECC generator 127.

After the ECC generator has received the last byte of data of a sector being stored, the final result is inserted in the last chunk of the data stream by operating the multiplexer 125, in response to a control signal in a line 129, to switch from receiving the input from the multiplexer 121 to receiving the result from the ECC generation circuit 127. The ECC is then stored in the same block of the memory array as the sector of user data from which it was generated. At the end of generating and inserting ECCs into the data stream for each of a group of four sectors of data, the registers 133-136 are reset by a signal in a line 141.

Referring to FIG. 6C, additional details of the BCP processing 36 are given. A number of bad column pointers (BCPs) for each of the memory sectors being programmed at a particular time are loaded by the micro-controller 23 into registers 118 from a reserved block of the flash memory (described hereinafter with respect to FIG. 11). Four BCPs 0-3 are stored for each of the memory units to which the stream 101 (FIG. 5) is being directed. That is, all four BCPs 0-3 for each of these four units have been written by the micro-controller 23 from the reserved block into four planes (sets) of registers 118, each set having four registers. Each of the planes of registers 118 shown in FIG. 6C contains BCPs 0-3 for a different unit. A control signal in a line 123 switches between these register planes in order that the BCPs for the unit for which a chunk of data currently in the stream of data from the buffer 35 through the multiplexer 121 is destined. A multiplexer 120 outputs one of the register values to one input of a comparator 132, whose output is the line 108 that contains the BCP hit signal. One of four registers 122 is also included for each of the units for to which data of the current stream will be written. Each of the registers 122 begins with a count that causes the multiplexer 120 to select BCP0 for its unit. Each time a BCP hit signal in line 108 occurs, circuits 124 and 126 causes the BCP count of the appropriate register 122 to increment by one.

A second input of the comparator 132 is formed from the contents of registers 128 and 130. These registers contain the current physical memory location for storage of the chunk and byte, respectively, to which the byte of data at the output of the multiplexer 121 is destined for storage within the flash memory. These registers are loaded by the micro-controller 23. Their combined physical memory byte address is then compared by the comparator 132 with that of one of the BCPs from the registers 118 of the destination memory unit for that data byte. When the first byte of user data for a given unit is present at the output of the multiplexer 121, its physical memory address from registers 128 and 130 is compared with BCP0 of the one of the registers 118 for that unit. If there is a positive comparison, then the BCP hit signal in line 108 becomes active. This results in the current byte of user data of ECC to be held and the fill byte from the register 110 inserted instead. The fill byte will then be written to the byte of memory cells including the bad column, instead of the current data byte.

The BCP hit signal also causes the count in the one of the registers 122 for that unit to switch the multiplexer 120 to select the next BCP1 for that memory unit. The BCP processor is then ready for this process to again take place when the physical memory byte location matches that of the next in order BCP for that unit. A stalled data byte is written during the next cycle, assuming this next physical address comparison does not result in another BCP hit, in which case the data byte is stalled yet another cycle. This process continues until the data stream formed of the current four sectors of data has been transferred to the flash memory, after which the process is repeated for different memory locations stored in the registers 128 and 130 in which the new sectors of data are to be written, and possibly changing the BCPs stored in one or more of the planes of registers 118 if the new data is to be written into one or more different memory units than before.

Referring again to FIG. 4, the specification of a block of the memory array that stores a sector of data and the ECC is given. As additional overhead information, a first byte 145 provides basic information of how the remaining data is written. This can include, for example, one or two bits that designate the relative values or polarity with which the stored data needs to be read. This is often changed from block to block and over time, in order to even the wear caused by programming the cells of a block to one of the programmed states from their erased state (which can also be one of the programmed states). This is described further below with respect to FIGS. 15-17. A next component is data 147 which is, for what has been described so far, one sector of user data supplied by the host system for storage in the non-volatile memory system. The component 149 is the ECC was generated from the user data 147 during programming, in the manner described above. The number of cells in the individual blocks is chosen to leave a group 151 of cells, capable of storing 8 bytes in this example, as spares. These spares are shown in FIG. 4 to be at the end of the block when written or read, which is the case if there are no defects in the rest of the block which require use of some or all of these spares. The number of spare bytes 151 will be less than what is shown in FIG. 4 by the number of fill bytes that are inserted into the user data 147 by the BCP processing 36 to avoid bad columns. The insertion of a fill byte into the user data 147 causes subsequent bytes to be delayed by one byte, or moved to the right in the sector data diagram of FIG. 4, thus diminishing the number of spare bytes 151 at the end of the data stream by one.

The BCP processing and ECC generation circuits of FIGS. 6A-C are operated in a reverse manner when sectors of data are being read from the flash memory, except that an entire sector of data is read before data from another sector is read. The ECC generation circuits 37 calculate an ECC from the user data in the sectors as that data are passed one byte at a time through the circuit of FIG. 6A from the flash memory to the data buffer 35, in the same manner as described above for writing data. The calculated ECC is then compared with the ECC bytes stored as part of the sector in order to determine whether the sector's user data is valid or not. The BCP processing identifies bytes in the read stream of data that are fill bytes by comparing the physical memory location from which each byte is read with the BCPs for the memory unit is which the sector of data is stored. Those bytes are then eliminated from the read data stream before writing the sector of data into the buffer memory 35.

Referring to FIG. 7, the programming of data described in FIGS. 4-6 is summarized. The dashed line represents the order of chunks of data appearing in the data stream 101 generated by the system of FIGS. 1-3 for four data sectors A-D, where each sector is transferred in 8 chunks. As can be seen, the first chunks of sectors A, B, C and D appear, in that order, followed by the second chunks of sectors A, B, C and D, and so forth, until the eighth and final chunks of data sectors A, B, C and D are include. Thereafter, the process is likely repeated with four different sectors of data.

It will be noted that the overhead information that is stored in a block along with a sector of data is limited to information about the data itself and does not include physical overhead information about the block or its operation. Prior memory systems, particularly those which emulate a disk drive by storing 512 byte sectors of user data, have also stored, in the individual user data blocks, information about the block's characteristics in terms of experience cycles, numbers of pulses or voltages required to program or erase the block of cells, defects within the block, and like information about the storage media, in addition to an ECC generated from the data stored in the block. As part of the present invention, however, this type of information about the physical block is stored in another block. As a specific example, individual block overhead records containing such information of a large number of blocks are stored in other memory blocks dedicated to such overhead information and which do not contain user data. Such information of the memory array that affects a number of blocks, such as the identification of bad columns, is stored in yet other memory blocks in order to minimize the memory space that is required for such information. In either case, the overhead information for a given block is read from these other blocks as part of the process of accessing the given block to either read data from it or program data into it. The block overhead information is usually read by the controller prior to accessing the block to read or write user data.

FIG. 8 illustrates a few such block overhead data records 151-157 that are stored together in a single memory array block in the format of FIG. 4. That is, the multiple overhead records of other blocks form the data 147 of a sector of overhead data that includes the flag byte 145 and ECC bytes 149 generated from the overhead data 147. The block in which the overhead data sector is stored also includes the spare bytes 151 of cells for replacing any cells within a defective column. This sector of overhead data and the block in which it is stored have the same characteristics, and are written and read the same, as described above for user data sectors. The primary difference is the nature of the data 147. In a specific example, each such overhead record contains four bytes of data, resulting in 128 such records being combined together into each defined sector of overhead data.

FIG. 9 illustrates example contents of a block overhead record for a good user data block. Byte 0 contains flags including an indication that the user data block is a good one. Byte 1 specifies a voltage for erasing the user data block, and byte 2 a programming voltage. These two voltages are updated over the life of the memory system by the controller in response to the subject user data block requiring an increasing number of erasing or programming pulses to reach the desired respective erase and programmed states. The controller uses this information when erasing or programming, respectively, the subject user data block for which the record 151 contains overhead data. Byte 3 of the overhead data record indicates the extent of use of the subject user data block, either as an experience count that is updated each time the subject user data block is erased and reprogrammed or as the characteristics of one or more tracking cells that are put through the same number of erase and reprogramming cycles as their corresponding user data block. The use of such tracking cells, preferably associated with each of at least the blocks of the memory array designated to store user data, is described in aforementioned U.S. patent application Ser. No. 08/910,947. Data in byte 3 is periodically rewritten as the number of cycles of use increase or as the characteristics a tracking cell change significantly. The value of byte 3 is used to determine when the associated user data block needs to be retired from service. Use of tracking cells, rather than an experience count, has a significant advantage that the overhead sector data need be rewritten far less frequently, as little as just a few times over the lifetime of the memory array, rather than after each erase/program cycle.

FIG. 10 illustrates an overhead record for a user data block that has exceeded its useful lifetime or otherwise has been determined by the controller to be a defective block. The flag byte indicates that the block is defective and a spare block has been assigned to take its place. (Not to be confused with the flag byte 145 (FIG. 4) that is at the beginning of the individual data sectors.) The other three bytes of the record specify, as part of the current user data block overhead data, the spare block's address. Thus, the three bytes used for a good block to specify its operating parameters (FIG. 9) are efficiently used for this other purpose for a defective block. This minimizes the number of bytes required for the overhead data. When the controller reads this record as part of the process of accessing its user data block, it is quickly determines that the addressed block is defective and the address of the spare block provided in the record of FIG. 10 is then used by the controller to address and access the spare user data block.

This arrangement of blocks thus requires that a number of spare blocks be provided in addition to the number of user data blocks necessary to fill the address space specified for the memory array. The overhead records for these blocks designate their status as spares in the flag byte, and whether they are good or defective spare blocks. If a good spare block, the record contains the same bytes 1-3 as the record of FIG. 9. If a defective spare block, the bytes 1-3 need not contain any overhead information of the block since it will never be used.

Any defects of the memory cell array that affect many blocks of cells, such as defective columns as can occur when a bit line has a short circuit to some other element, are stored in other blocks in order to compact the block overhead records. An example shown in FIG. 11 is a bad column pointer (BCP) table stored as data in a block having the data format of FIG. 4. Such a table is made during the testing phase of the memory system manufacturing process. In this example, up to four BCPs of two bytes each may be stored for each of the memory cell units 0-7. Since eight spare bytes of cells are included as spares 151 in a typical user data block (FIG. 4), two bytes of cells may be skipped in a single block in response to the controller reading one BCP from the table of FIG. 11. If there are more than four bad columns in a unit, that unit is identified as defective and not used. The memory system may operate so long as at least one unit remains usable. Alternatively, since the column lines of each unit may be segmented, some number of BCPs, such as two, may be stored for each segment or for individual groups of segments. It does, of course, take more memory to store an expanded BCP table.

During operation of the memory, the BCP table of FIG. 11 and as many overhead data blocks of FIGS. 8-10 as space allows, are read from the memory blocks by the controller into its RAM 29 (FIG. 1) without deleting that overhead data from the non-volatile memory. This is done upon initialization of the memory system and, if there is not enough room in the RAM 29 for all of the block overhead sectors of data, those that are less frequently accessed by the controller are deleted from the RAM 29 in favor of those that need to be accessed. Since this data can be read much faster by the controller from its own RAM 29 than from a non-volatile memory block, the "caching" of such data in the controller memory speeds up the process of accessing non-volatile memory blocks containing user data since the overhead data must also be accessed.

The controller 11 may access a number of user data sectors in response to receipt from a host system of a command containing an address, such as a in a cylinder/head/sector format, as in a disk drive, or as a logical block. The controller then calculates a logical address of a beginning block corresponding to the beginning sector address provided by the host. The memory system address space for a given array chip may be expressed as a continuum of logical block addresses (LBAs) that represent all available blocks on the chip in its good memory units for storing user data. The block overhead records are logically arranged in that same order. The controller then first reads the block overhead record in its RAM 29 that corresponds to the first data sector specified by the host while a physical address within the memory array of the user data block is being calculated from its LBA. After accessing the first user data block and its overhead information, the logical block address need not be recalculated for each subsequent block that is addressed for data of the particular file. A simple counter will step through the overhead records that have been organized in the order of their respective user data blocks. If all of the necessary overhead records are not in the controller's RAM 29 at the time of this access, the required overhead data sectors are preferably first read from the non-volatile memory into the RAM 29, including those of substitute blocks whose addresses are contained in the initial overhead records.

One advantage of storing the block overhead data in records separate from the block is the reduced number of times that such records must be rewritten. In the present embodiment, the overhead blocks of data need not be rewritten frequently, perhaps only two or three times during the lifetime of the memory system and sometimes not at all. Any change to the overhead information record for one block is held as long as possible in a controller memory before rewriting the overhead data sector in which record exists, and then it can be done in the background without being part of an erase or programming cycle. But when the overhead data of a block is stored in that block, the overhead data must be reprogrammed each time the block is erased. In the examples described herein where only one sector of user data is stored in a block, overhead data would have to be rewritten in one block every time a sector of user data is written into that memory block. This can also require the overhead information to be written twice into the same block, once before writing the user data and once after doing so, in order to compensate for effects due to programming adjacent cells, particularly when being programmed in multiple states where the tolerance of such effects is less.

Although the memory system examples being described store only one sector of user data in each of the individual blocks, various aspects of the present invention apply equally well where two or more sectors of data, each with its flag and ECC bytes, are stored in individual blocks of the memory cell array.

FIG. 12 provides an example utilization of the individual blocks of a memory array chip having eight units of blocks. The same boot information is stored in a specified block of each of the units, usually the first block. Upon initialization of the system, the controller firmware causes the first block of unit 0 to be read but if that block is not readable or its stored data corrupted, the first block of unit 1 is accessed for reading, and so on, until valid memory system boot information is read by the controller. It is then stored in the controller RAM 29. There are also a number of reserved blocks, such as reserved blocks 0-7 being shown in FIG. 12, in which data desirable for operation of the memory array chip are stored. A copy of the data of each of the reserved blocks is provided in a different memory unit than the primary copy as insurance against a defective unit. The data format of each of the reserved blocks is that illustrated in FIG. 4.

Part of the boot information is a physical address of reserved block 0 and its copy, which, in a specific example, contains the bad column pointers of FIG. 11, an identity of any unusable unit(s), and physical mapping characteristics including which of the blocks of good units are reserved, those designated for user data, those designated for overhead data ("O.H. Data") according to FIGS. 8-10, and those designated as spare blocks. Reserved block 0 also contains read and write control parameters particular to its memory array chip.

The other reserved sectors contain information that is useful to the controller to operate the memory array chip on which they are located, or useful to the entire memory system. Reserved block 1, for example, can contain data of system parameters that appears on only the first logical memory array chip of the system, including a specification of the data interface 13 of the controller with the host system. Another reserved block may contain manufacturing information, for example. The data stored in the boot information and reserved blocks are written as part of the manufacturing process. This data may be made modifiable after manufacture, either in part or in total.

FIG. 13 illustrates a desired step in the manufacturing configuration process. Data about each memory array chip is read by the controller 11 from the reserved sector 0 of each chip and assembled into a common file illustrated in FIG. 14 that is then written back into reserved sector 2 of the first logical chip 17 of the memory system. This process can be provided by firmware included in the program memory 27 (FIG. 1) of the controller. Upon invoking this firmware routine during the system configuration, data of the number of good user data blocks is read from each of the system's memory chips. That information then becomes a part of the system record of FIG. 14. Logical block address (LBA) ranges are also added to that record, the first user block of the first logical memory chip 17 being assigned an address of 0000. The ending LBA is also recorded as part of the record, being the beginning LBA of zero plus the number of user data blocks on the first chip. The logical memory space for the next memory chip 19 is noted by its number of good user data blocks and its ending LBA, which is one more than the ending LBA of the first memory chip plus the number of good user data blocks in the second chip. This process continues until the table of FIG. 14 is completed for all the memory array chips.

In a specific example, the entry in the table of FIG. 14 for each memory chip in the system includes a one byte physical chip number and three bytes for the ending LBA. This results in the merged system LBA table being very short and quick to access. When accessing a particular user data block of the system in response to an address from a host system, as a particular example, the controller 11 first calculates a corresponding logical block address. That LBA is then compared with the table (FIG. 14) in reserved block 2 of the first logical memory chip 17 to determine on which of the chips the addressed block lies. The LBA is of the immediately preceding logical chip is then subtracted from the calculated LBA. The physical block address on that chip is then calculated by the controller reading the designated chip's reserved sector 1 information to shift this differential LBA into a corresponding block of the designated chip that has been designated for user data storage.

In addition to storing a record of the number of good units and sectors from which the merged table of FIG. 14 is formed, each of the memory array chips includes other information about its respective array that the controller uses to operate it. This other information can also be stored in the reserved sector 0 of each chip array. Another feature of the present invention is that multiple array chips that are used together with a common controller in one system need not each have these same characteristics. The controller 11 preferably reads the characteristics stored in reserve sector 0 of an individual chip into its RAM 29 before accessing that chip. This can be once when the memory system in initialized, provided the controller RAM 29 is large enough, and then accessed from RAM during operation of the memory. Alternately, this information can read from a particular chip just before it is accessed each time and then stored in the RAM 29 only during the time of such access. It is a significant advantage to be able to form a memory system with two or more memory chips that have different operating characteristics. This greatly simplifies the manufacturing process since memory chips from different process batches, different foundries, different manufacturers, and so on, can be combined to operate well together. Testing of the chips in order to batch together those having the same values of these characteristics is no longer necessary.

These characteristics that can be different among memory chips include various optimal voltages and timing, as well as minimum and maximum permitted values, for use to program, read, erase, scrub and refresh the chip. The optimal number of programming pulses, their durations, frequency and magnitudes, as well as operating characteristics of voltage pumps on the chip, including ranges of maximum and minimum values can also be included. The number of sectors per unit and other information needed by the controller to translate a logical block address to a physical one within the particular chip are also stored. Pointers to spare units and blocks within units may also be included. Other information includes pointers to the physical locations of the reserved sectors so that they need not all be stored in the same blocks in each memory chip of a system. The number of user data blocks for which data is included in each of the overhead blocks (FIG. 8) can also be stored. Inclusion of the bad column pointers (BCPs) in reserved sector 0 has already been described. A duplicate set of certain operating parameters can also be included for different chip supply voltages, such as 3 and 5 volts. The controller can then tailor its access to match the characteristics of each chip in the system, which need not, as a result, be made the same.

The flag byte 145 (FIG. 4) of a sector of data is described with respect to FIG. 15. In a specific example, the most significant bits 0 and 1 of that byte give a factor by which all the following bits in that sector are transformed. These two bits are preferably randomly selected during the writing process for each sector of data by the micro-controller 23 or fixed logic such as a state machine, prior user data of the sector being read into the data stream 101 (FIG. 5). Alternatively, the transformation bits may be assigned by sequencing through all the possible combinations in order. These transformation bits are positioned at the beginning of the remaining flag bits, which are in turn inserted into the stream of data prior to the user data and ECC bytes that form the sector being stored. The purpose of so transforming the data stored in the flash memory is to cause the memory cells to be programmed to different states for the same data. This prevents uneven wear of the various blocks of the memory that can occur over the life of the memory, such as when substantially the same data file is repetitively written to the same group of blocks. When the data sector is read, these transform bits are first read and then used to transform the raw data read from the memory back to the data that was originally received by the memory for storage. Two transform bits are used for a four state memory operation, more being used when the number of storage states of the individual memory cells is made higher. If the memory is operating in a two state mode, however, only one transformation bit is used.

FIG. 16 illustrates an example process of transforming received data before being stored in the flash memory. This process can be carried out primarily by the micro-controller 23 under the control of its firmware, or can be executed by the use of adder circuits and related digital elements. Each byte of data from the buffer 35 has its bits separated into four pairs, and each bit pair is combined in respective adders 175-178 with the two bit transform (for a four state flash memory) that is held at 181. The transformed bit pairs are then recombined into a single byte that is applied to one input of a multiplexer 183. These transform bits are also used to transform, in adders 185-187, six fill bits indicated at 189. The transform bits themselves are combined with the transformed fill bit pairs to form the first byte 145 (FIG. 4) of a data sector, that is applied to a second input of the multiplexer 183. A control signal in a line 191 then switches the multiplexer 183 to output in circuits 193 successive bytes of data wherein the first byte of the sector is in the form of FIG. 15 received through the multiplexer 1 input and subsequent bytes of transformed data are received through the 0 input until the entire sector of data is transformed and sent to the flash memory. It is this transformed data, rather that the raw data received from the host, that is subjected to the BCP processing and ECC generation of FIG. 6A.

An inverse transform takes place when the sector of data is read from the flash memory, as illustrated in FIG. 17. Four subtraction elements 195-198 receive respective pairs of bits of a data byte received in the path 194 form the flash memory. The two transform bits for the particular data sector are stored at 199, which may be a register. The transform bits, which are the first two bits of the first byte received for the sector, are stored at 199 in response to receiving the first byte control signal in the line 191. These two bits are combined with each of the received byte pairs in the subtracting elements 195-198 in a manner to transform them back to the raw received data. The inverse transform of the sector data after the first two bits commences immediately after those transform bits are read. There is certainly no need to read the transform bits in a separate operation. The remaining 6 bits of the first byte are immediately transformed by its three pairs passing through three of the subtracting elements 195-198 and then being stored at 201 in response to the control signal in the line 191. As subsequent bytes of the data sector are received, one at a time, the contents at 199 and 201 remain unchanged while the inverse transform of the data bytes is made and the result output to the buffer memory 35 over a circuit 203. This output data is then the same as that which was initially received by the memory system and stored in a transformed form.

The least significant bits 4-7 of the flag byte 145 illustrated in FIG. 15 are used by the controller to determine whether a block is erased or not. In one example of a memory system, the erased state is also one of the programmed states, so some care needs to be taken to distinguish between them. When necessary to determine whether a block in this type of system is erased from the data in the block, therefore, the sampling of one bit of data, for example, cannot itself provide the answer. Therefore, in one example, fill bits 189 (FIG. 16) that are written into the first byte of a data sector are either a fixed known pattern or made to have a pattern that assures those bits are not all equal to the value of the erased state. The controller reads any data sector in the block and looks for whether the pre-erase bits 173 stored in the corresponding cells of the block either are the fixed values of the fill bits 189 or, if there is no known pattern, at least one of them (and preferably more) is in a programmed state that is not the erased state. As a further check, it may be determined whether an ECC code is present in the data sector. If either or both of these conditions are determined to exist, it is concluded that the block is not erased. But if the bit values of data read from the flag byte bit locations 4-7 and/or the ECC all have the same value equal to that of the erased state, this indicates that the block is in its erased state.

Although specific examples of various aspects of the present invention have been described, it is understood that the present invention is entitled to protection within the scope of the appended claims.

The invention claimed is:

1. A method of operating a re-programmable non-volatile memory system having its memory cells organized into distinct blocks of simultaneously erasable cells, comprising:
receiving data from outside the memory system for storage in the memory system,
designating a first group of one or more blocks of memory cells for storage of the received data,
generating records of characteristics of individual ones of the first group of blocks of memory cells,
writing the received data into a first group of blocks of memory cells but not including the generated records of characteristics of said first group of blocks of memory cells,
writing the generated records of characteristics of individual ones of the first group of blocks of memory cells into a second group of one or more blocks of memory cells but without including the received data.

2. The method of claim 1, wherein storing the plurality of records in individual ones of the second group of said blocks includes storing a redundancy code generated from records written therein.

3. The method of claim 1, wherein storing, in the second group of blocks, the plurality of records of characteristics of the first group of blocks individually includes storing programming and reading characteristics of a corresponding one of the first group of blocks.

4. The method of claim 1, additionally comprising:
reading the records from a plurality of said second group of blocks and storing the read records in a controller memory, and
when accessing one or more of the first group of blocks to program received data therein or to read received data therefrom, reading from the controller memory those of the records stored therein which contain the characteristics of said one or more of the first group of blocks being accessed.

5. The method of claim 4, wherein records of at least one of the plurality of second blocks stored in the controller memory which have the longest time since being read are removed therefrom when a limited capacity of the controller memory requires space to be made for records from another of the plurality of said second blocks to be stored therein in order to be read when one or more of corresponding ones of the first group of blocks is being accessed.

6. The method of claim 4, wherein, when a plurality of the first group of blocks with successive addresses are being accessed, an address of a record stored in the controller memory that corresponds to a first of the addressed block within the first group of blocks is calculated and remaining records within the controller memory that correspond to others of the plurality of the first group of blocks being accessed are addressed by incrementing from one record address to another.

7. The method of claim 1, wherein storing, in the second group of blocks, the plurality of records of characteristics of the first group of blocks individually includes storing an indication of whether a corresponding block within said first group is defective or not, and, if so, storing in the second group of blocks an address of a substitute block, and, if not, storing in the second group of blocks operating characteristics of the corresponding block within said first group.

8. The method of claim 7, wherein storing operating characteristics includes storing any of programming, reading, erase or wear characteristics of the corresponding block within the first group.

9. The method of claim 1, wherein storing, in the second group of blocks, the plurality of records of characteristics of the first group of blocks individually includes storing indications of locations of any bad columns that extend through corresponding blocks within said first group.

10. The method of claim 9, wherein storing received data into individual ones of the first group of blocks and storing block characteristic records into individual ones of the second group of blocks includes skipping any bad column locations in the respective blocks.

11. The method of any one of claim 1, 3 or 7, wherein characteristics of the received data being stored in individual ones of the first group of said blocks are additionally stored therein along with the received data to which such characteristics relate.

12. The method of any one of claim 1, 3 or 7, wherein the memory cells within at least a plurality of said blocks are individually operated with more than two storage states in order to store more than one bit of data per memory cell.

13. The method of any one of claim 1, 3 or 7, wherein the memory cells within at least a plurality of said blocks are individually operated with exactly two storage states in order to store exactly one bit of data per memory cell.

* * * * *